US011678117B2

(12) United States Patent
Audfray et al.

(10) Patent No.: US 11,678,117 B2
(45) Date of Patent: Jun. 13, 2023

(54) INDEX SCHEMING FOR FILTER PARAMETERS

(71) Applicant: Magic Leap, Inc., Plantation, FL (US)

(72) Inventors: Remi Samuel Audfray, San Francisco, CA (US); Jean-Marc Jot, Aptos, CA (US); Samuel Charles Dicker, San Francisco, CA (US)

(73) Assignee: Magic Leap, Inc., Plantation, FL (US)

( * ) Notice: Subject to any disclaimer, the term of this patent is extended or adjusted under 35 U.S.C. 154(b) by 399 days.

(21) Appl. No.: 17/111,318

(22) Filed: Dec. 3, 2020

(65) Prior Publication Data

US 2021/0160616 A1 May 27, 2021

Related U.S. Application Data

(63) Continuation of application No. 16/985,941, filed on Aug. 5, 2020, now Pat. No. 11,012,778, which is a continuation of application No. 16/427,315, filed on May 30, 2019, now Pat. No. 10,779,082.

(60) Provisional application No. 62/678,259, filed on May 30, 2018.

(51) Int. Cl.
*H04R 3/04* (2006.01)
*H04R 29/00* (2006.01)

(52) U.S. Cl.
CPC ............ *H04R 3/04* (2013.01); *H04R 29/001* (2013.01); *H04R 2430/01* (2013.01)

(58) Field of Classification Search
CPC ..... H04R 3/04; H04R 29/001; H04R 2430/01
USPC .................. 381/57, 56, 58, 59, 98, 103, 104
See application file for complete search history.

(56) References Cited

U.S. PATENT DOCUMENTS

| | | |
|---|---|---|
| 5,491,754 A | 2/1996 | Jot |
| 5,812,674 A | 9/1998 | Jot |
| 6,188,769 B1 | 2/2001 | Jot |
| 6,453,047 B1 | 9/2002 | Dicker |
| 6,665,407 B1 | 12/2003 | Dicker |

(Continued)

FOREIGN PATENT DOCUMENTS

| | | |
|---|---|---|
| WO | 2019079523 A1 | 4/2019 |
| WO | 2019232278 A1 | 12/2019 |

OTHER PUBLICATIONS

Audfray, R. et al. (2018). "Practical Realization of Dual-Shelving Filter Using Proportional Parametric Equalizers," Audio Eng. Society 145th Convention, Paper 10054, Oct. 17-20, 2018, New York, NY, seven pages.

(Continued)

*Primary Examiner* — Vivian C Chin
*Assistant Examiner* — Con P Tran
(74) *Attorney, Agent, or Firm* — Morrison & Foerster LLP

(57) ABSTRACT

A method of processing an audio signal is disclosed. According to embodiments of the method, magnitude response information of a prototype filter is determined. The magnitude response information includes a plurality of gain values, at least one of which includes a first gain corresponding to a first frequency. The magnitude response information of the prototype filter is stored. The magnitude response information of the prototype filter at the first frequency is retrieved. Gains are computed for a plurality of control frequencies based on the retrieved magnitude response information of the prototype filter at the first frequency, and the computed gains are applied to the audio signal.

18 Claims, 19 Drawing Sheets

(56) References Cited

U.S. PATENT DOCUMENTS

| | | | |
|---|---|---|---|
| 6,798,889 B1 | 9/2004 | Dicker | |
| 6,917,686 B2 | 7/2005 | Jot | |
| 6,978,027 B1 | 12/2005 | Dahl | |
| 7,099,482 B1 | 8/2006 | Jot | |
| 7,149,314 B2 | 12/2006 | Dahl | |
| 7,231,054 B1 | 6/2007 | Jot | |
| 7,257,231 B1 | 8/2007 | Avendano | |
| 7,315,624 B2 | 1/2008 | Avendano | |
| 7,412,380 B1 | 8/2008 | Avendano | |
| 7,561,699 B2 | 7/2009 | Jot | |
| 7,567,845 B1 | 7/2009 | Avendano | |
| 7,848,531 B1 | 12/2010 | Vickers | |
| 7,928,311 B2 | 4/2011 | Trivi | |
| 7,970,144 B1 | 6/2011 | Avendano | |
| 8,000,485 B2 | 8/2011 | Walsh | |
| 8,019,093 B2 | 9/2011 | Avendano | |
| 8,107,631 B2 | 1/2012 | Merimaa | |
| 8,280,077 B2 | 10/2012 | Avendano | |
| 8,345,899 B2 | 1/2013 | Merimaa | |
| 8,374,365 B2 | 2/2013 | Goodwin | |
| 8,379,868 B2 | 2/2013 | Goodwin | |
| 8,488,796 B2 | 7/2013 | Jot | |
| 8,619,998 B2 | 12/2013 | Walsh | |
| 8,712,061 B2 | 4/2014 | Jot | |
| 8,879,750 B2 | 11/2014 | Walsh | |
| 8,908,874 B2 | 12/2014 | Johnston | |
| 9,014,377 B2 | 4/2015 | Goodwin | |
| 9,042,565 B2 | 5/2015 | Jot | |
| 9,197,979 B2 | 11/2015 | Lemieux | |
| 9,253,574 B2 | 2/2016 | Thompson | |
| 9,386,373 B2 | 7/2016 | Ma | |
| 9,391,579 B2 | 7/2016 | Walsh | |
| 9,496,850 B2 | 11/2016 | Jot | |
| 9,530,421 B2 | 12/2016 | Jot | |
| 9,697,844 B2 | 7/2017 | Walsh | |
| 9,728,181 B2 | 8/2017 | Jot | |
| 9,754,597 B2 | 9/2017 | Jot | |
| 9,794,721 B2 | 10/2017 | Goodwin | |
| 9,865,245 B2 | 1/2018 | Kamdar | |
| 9,924,289 B2 | 3/2018 | Trivi | |
| 10,038,967 B2 | 7/2018 | Jot | |
| 10,063,207 B2 | 8/2018 | Malak et al. | |
| 10,779,082 B2 | 9/2020 | Audfray et al. | |
| 11,012,778 B2 | 5/2021 | Audfray et al. | |
| 2008/0159370 A1* | 7/2008 | Atherton | H04L 25/03343 375/232 |
| 2011/0251704 A1 | 10/2011 | Walsh | |
| 2013/0041648 A1 | 2/2013 | Osman | |
| 2013/0236040 A1 | 9/2013 | Crawford | |
| 2015/0036841 A1 | 2/2015 | Lorente | |
| 2015/0302652 A1 | 10/2015 | Miller | |
| 2016/0088417 A1 | 3/2016 | Kim | |
| 2016/0378427 A1* | 12/2016 | Sharma | G10L 19/0212 700/94 |
| 2017/0126194 A1 | 5/2017 | Jot | |
| 2017/0127212 A1 | 5/2017 | Jot | |
| 2017/0208415 A1 | 7/2017 | Ojala | |
| 2017/0208416 A1 | 7/2017 | Petrov | |
| 2017/0223478 A1 | 8/2017 | Jot | |
| 2017/0288625 A1 | 10/2017 | Kim | |
| 2017/0325043 A1 | 11/2017 | Jot | |
| 2018/0295356 A1 | 10/2018 | Lee | |

OTHER PUBLICATIONS

Audfray, R. et al. (2019). "Headphone Technology," 2019 AES International Conference, Aug. 27-29, 2019, San Francisco, CA, Powerpoint presentation, 28 slides.

Avendano, C. (Jun. 2002). "Frequency Domain Techniques for Stereo to Multichannel Upmix," Audio Eng. Society, 22nd International Conf. for Virtual, Synthetic, and Entertainment Audio, 10 pages.

Avendano, C. et al. (Apr. 2002). "Ambience Extraction and Synthesis from Stereo Signals for Multi-channel Audio Up-mix," IEEE ICASSP (International Conf. Acoustics, Speech and Signal Processing), pp. II-1957-II-1960.

Avendano, C. et al. (Jul./Aug. 2004). "A Frequency-Domain Approach to Multichannel Upmix," Journal of the Audio Engineering Society 52:7/8, 12 pages.

Dahl, L. et al. (Dec. 2000). "A Reverberator Based on Absorbent All-Pass Filters," Proceedings of the Cost G-6 Conference on Digital Audio Effects (DAFX-00), Verona, Italy, Dec. 7-9, 2000, six pages.

Funkhouser, T. et al. (2003). "Survey of Methods for Modeling Sound Propagation in Interactive Virtual Environment Systems," Presence 53 pages.

Funkhouser, T. et al. (Jul. 2002). "Sounds Good to Me! Computational Sound for Graphics, VR, and Interactive Systems," SIGGRAPH Course Notes, 43 pages.

Goodwin, M. M. et al. (Mar. 2007). "Multichannel Surround Format Conversion and Generalized Upmix," 30th International Conf. Audio Engineering Society, Saarislka, Finland, Mar. 15-17, 2007, nine pages.

Goodwin, M. M. et al. (May 2006). "A Frequency-domain Framework for Spatial Audio Coding Based on Universal Spatial Cues," Convention Paper 6751, Audio Engineering Society, 120th Conv., Paris, France, May 20-23, 2006, 12 pages.

Goodwin, M. M. et al. (Oct. 2006). "Analysis and Synthesis for Universal Spatial Audio Coding," Convention Paper 6874, Audio Engineering Sciety, 121st Conv., San Francisco, California, Oct. 5-8, 2006, 11 pages.

Goodwin, M. M. et al. (Oct. 2007). "Binaural 3-D Audio Rendering Based on Spatial Audio Scene Coding," Convention Paper 7277, Audio Engineering Society, 123rd Conv., New York, New York, Oct. 5-8, 2007, 12 pages.

Goodwin, M.M. et al. (Apr. 2007). "Primary-Ambient Signal Decomposition and Vector-Based Localization for Spatial Audio Coding and Enhancement," Proc. IEEE ICASSP (2007 International Conf. on Acoustics, Speech and Signal Processing), pp. I-9-I-12.

Goodwin, M.M. et al. (Oct. 2008). "Spatial Audio Scene Coding," Convention Paper 7507, Audio Engineering Society, 125th Convention, San Francisco, California, Oct. 2-5, 2008, eight pages.

International Preliminary Report on Patentability and Written Opinion dated Dec. 10, 2020, for PCT Patent Application No. PCT/US2019/034755, filed May 30, 2019, fifteen pages.

International Search Report and Written Opinion dated Nov. 5, 2019, for PCT Patent Application No. PCT/US2019/034755, filed May 30, 2019, eight pages.

International Search Report dated Jan. 3, 2019, for PCT Patent Application No. PCT/US2018/056385, filed Oct. 17, 2018, three pages.

Johnston, J.D. et al. (Nov. 2010). "Beyond Coding—Reproduction of Direct and Diffuse Sounds in Multiple Environments," Convention Paper 8314, 129th Conv. Audio Eng. Soc., San Francisco, California, Nov. 4-7, 2010, nine pages.

Jost, A. et al. (Dec. 2000). "Transaural 3-D Audio With User-Controlle Calibration," Proceedings of the COST G-6 Conference on Digital Audio Effects (DAFX-00), Verona, Italy, Dec. 7-9, 2000, six pages.

Jot, J-M. (Oct. 2012). "Object-Based Audio Content Authoring and Distribution for Interactive and Linear Soundtracks," 133rd Conv. Audio Engineering Society, 12 pages.

Jot, J-M. et al. (May 2003). "Spatial Enhancement of Audio Recordings," AES 23rd International Conference, Copenhagen, Denmark, May 23-25, 2003, 2003, 11 pages.

Jot, J-M. et al. (Oct. 2007). "Spatial Audio Scene Coding in a Universal Two-Channel 3-D Stereo Format," Convention Paper 7276, Audio Engineering Society, 123rd Conv., New York, New York, Oct. 5-8, 2007, 15 pages.

Jot, J-M. (2000). "Proposal for 1A-SIG 3D Audio Rendering Guideline Level 3 (I3DL3)," IA-SIG 3D Audio Workgroup Meeting, Powerpoint presentation, 13 pages.

Jot, J-M. (Apr. 2012). "Enhancing the 3D TV Experience through Next-Generation 3D Audio Coding and Processing Technology," NAB Broadcast Engineering Conf. listing of presentations only, one page.

(56) References Cited

OTHER PUBLICATIONS

Jot, J-M. (Apr. 2017). "New Immersive and Object-Based Multi-channel Audio Formats for Cinema, Entertainment and Cinematic VR," IEEE SPS Chapter Talk.
Jot, J-M. (Apr. 7, 2014). "Object-Based Immersive Audio for Next-Generation Boradcast," NAB Broadcast Engineering Conf., 26 pages.
Jot, J-M. (Aug. 2018). "Unleashing Wearable 3D Audio," Audio Eng. Soc. Conference on Audio for Virtual and Augmented Reality, 37 pages.
Jot, J-M. (Dec. 2000). "Efficient Models for Interactive Environmental Audio Spatialization," DAFx International Conf. Digital Audio Effects, 22 pages.
Jot, J-M. (Dec. 2012). "Interactive 3D Audio Rendering in Flexible Playback Configurations," IEEE APSIPA Conf., nine pages.
Jot, J-M. (Feb. 2000). "Advanced Audio BIFS: Environmental Spatialization of Audio in MPEG-4, version 2," Audio Engineering Society, 108th Conv., Presentation, 17 pages.
Jot, J-M. (Feb. 2011). "Next-Generation 3-D Audio—Creation, Transmission and Reproduction," ATSC Symposium on Next Generation Broadcast Television, 20 pages.
Jot, J-M. (Feb. 2016). "Environmental Audio Effects in Games, VR and AR," Audio Eng. Soc., 61st Conf.—Audio for Games, Paragraph located on p. 7, and located at http://www.aes.org/conferences/61/schedule.cfm,last visited on Oct. 23, 2018, 10 pages.
Jot, J-M. (Feb. 2017). "Augmented Reality Headphone Reverberation," DSP Seminar at CCRMA, Stanford Univ, Palo Alto, CA., Abstract Only, one page.
Jot, J-M. (Jan. 1999) "Real-Time Spatial Processing of Sounds for Music, Multimedia and Interaction Human-Computer Interfaces," ACM Multimedia Systems, 7:55-69.
Jot, J-M. (Jan. 2008). "Prospects in Format-Agnostic Spatial Audio," 2nd International SpACE-Net Spatial Audio Workshop, list of presentations, 4 pages.
Jot, J-M. (Jun. 2018). "Towards 6-DoF XR Audio," Immersive Experience IX Symposium, 11 pages.
Jot, J-M. (Jun. 27, 2014). "Next-Generation Immersive Audio Content Standard and Consumer Format," IEEE International Symposium on Broadband Multimedia Systems and Broadcasting, 24 pages.
Jot, J-M. (Mar. 1992) "An Analysis/Synthesis Approach to Real-Time Artificial Reverberations," IEEE ICASSP International Conference on Acoustics, Speech and Signal Processing, San Francisco, CA, Mar. 23-26, 1992, pp. II-221-II-224.
Jot, J-M. (Mar. 2015). "DTS:X Next-Generation Consumer Audio Delivery Solution," AES 57th Conf. on the Future of Audio Entertainment Technology, 16 pages.
Jot, J-M. (Mar. 2015). "Integrating Object-, Scene-, and Channel-Based Immersive Audio for Delivery to the Home," AES 57th Conf. on the Future of Audio Entertainment Technology, presentation Workshop 2 p. m.., p. 5, 5 pages.
Jot, J-M. (May 2001). "Perceptual and Statistical Models for Virtual Environments." ACM Campfire: Acoustic Rendering for Virtual Environments, Preconference Proceedings, Snowbird, Utah, May 26-29, 2001, 10 pages.
Jot, J-M. (Nov. 18, 2013). "MDA—an Open Content Format for Next-Generation Immersive Audio," Forum International du Son Multicanal, 29 pages.
Jot, J-M. (Nov. 2012). "Multichannel 3D Audio Encoding and Reproduction," Forum International du Son Multicanal, 21 pages.
Jot, J-M. (Oct. 2007). "Efficient Description and Rendering of Complex Interactive Acoustic Scenes," Proc. of the 10th Int. Conference on Digital Audio Effects (DAFx-07), Bordeaux, France, Sep. 10-15, 2007, two pages.
Jot, J-M. (Oct. 2008). "Two-Channel Matrix Surround Encoding for Flexible Interactive 3-D Audio Reproduction," Convention Paper 7552, Audio Engineering Society, 125th Conv. San Francisco, California, Oct. 2-5, 2008, 13 pages.
Jot, J-M. (Oct. 2015). "Immersive Audio Processing and Effects for Games," 139th Conv. Audio Engineering Society, 25 pages.
Jot, J-M. (Oct. 2015). "Proportional Parametric Equalizers—Application to Digital Reverberation and Environmental Audio Processing," Convention Paper 9358, Audio Engineering Society, 139th Conv., New York, New York, Oct. 29-Nov. 1, 2015, eight pages.
Jot, J-M. (Oct. 2017). "Room-Adaptive Headphone 3D Audio," Audio Engineering Society, 143rd Conv.New York, New York, 23 pages.
Jot, J-M. (Oct. 9, 2013). "Object-Based Immersive Audio Content Format for Next-Generation Broadcast," IEEE Broadcast Symposium, 18 pages.
Jot, J-M. (Sep. 1997). "Efficient Models for Reverberation and Distance Rendering in Computer Music and Virtual Audio Reality," ICMC International Computer Music Conf., eight pages.
Jot, J-M. (Sep. 2017). "Efficient Reverberation Rendering for Complex Interactive Audio Scenes," DAFx 20th International Conf. Digital Audio Effects, 58 pages.
Jot, J-M. et al. (1995). "Le Spatialisateur," GRAME Conf. "Le Son et L'Espace." French only, seven pages.
Jot, J-M. et al. (2006). "Spatialisateur—Introduction," IRCAM (1995, revised 2006.).
Jot, J-M. et al. (2012). "Spatialisateur—Introduction," IRCAM (1995, revised 2012.) Located at http://web4.ircam.fr/transmission.html?event=1021&L=1..., last visited Oct. 23, 2018, two pages.
Jot, J-M. et al. (Feb. 1991). "Digital Delay Networks for Designing Artificial Reverberators," Audio Engineering Society, 90th Conv., Paris, France, Feb. 19-22, 1991, 17 pages.
Jot, J-M. et al. (Feb. 1995). "Digital Signal Processing Issues in the Context of Binaural and Transaural Stereophony," Audio Engineering Society, 98th Conv., Paris, France, Feb. 25-28, 1995, 47 pages.
Jot, J-M. et al. (Jun. 2016). "MDA—Open Standard for Immersive Audio Content Creation and Distribution," Immersive Experience IX Symposium, 33 pages.
Jot, J-M. et al. (Mar. 1999). "A Comparative Study of 3-D Audio Encoding and Rendering Techniques," Audio Eng. Society, 16th International Conf., 20 pages.
Jot, J-M. et al. (May 1995). "Spat~: a Spatial Processor for Musicians and Sound Engineers," CIARM'95 Conference, Ferrara (Italy) 1995, six pages.
Jot, J-M. et al. (May 2006). "Scene Description Model and Rendering Engine for Interative Virtual Acoustics," Convention Paper 6660, Audio Engineering Society, 120th Conv., Paris, Francs, May 20-23, 2006, 13 pages.
Jot, J-M. et al. (May 2010). "Center-Channel Processing in Virtual 3-D," Convention Paper 8116, Audio Engineering Society, 128th Conv., London, UK, May 22-25, 2010, 10 pages.
Jot, J-M. et al. (Oct. 1993). "Biaural Concert Hall Simulation in Real Time," IEEE Workshop on Applications of Digital Signal Processing to Audio and Acoustics. Located at: http://architexte.ircam.fr/textes/Jot93a/index.html, last visited Oct. 15, 2018, 17 pages.
Jot, J-M. et al. (Oct. 2006). "Binaural Simulation of Complex Acoustic Scenes for Interactive Audio," Convention Paper 6950, Audio Engineering Society, 121st Conv., San Francisco, California, Oct. 5-8, 2006, 20 pages.
Jot, J-M. et al. (Oct. 2011). "Beyond Surround Sound-Creation, Coding and Reproduction of 3-D Audio Soundtracks," Convention Paper 8463, Audio Engineering Society, 131st. Conv., New York, New York, Oct. 20-23, 2011, 11 pages.
Jot, J-M. et al. (Oct. 2015). "Dialog Control and Enhancement in Object-Based Audio Systems," Convention Paper 9356, Audio Engineering Society, 139th Conv., New York, New York, Oct. 29-Nov. 1, 2015, seven pages.
Jot, J-M. et al. (Oct. 2016). "Augmented Reality Headphone Environment Rendering," Audio Eng. Soc. Conf. on Audio for Virtual and Augmented Reality, Los Angeles, California, Sep. 30-Oct. 1, 2016, six pages.
Jot, J-M. et al. (Oct. 2017). "Efficient Structures for Virtual Immersive Audio Processing," Convention paper 9865, Audio Engineering Society, 143rd Conv. Presented in New York, New York, Oct. 18-21, 2017, eight pages.

(56) References Cited

OTHER PUBLICATIONS

Jot, J-M. et al. (Sep. 1997). "Analysis and Synthesis of Room Reverberation Based on a Statistical Time-Frequency Model," Audio Engineering Society, 103rd Convention, 31 pages.
Jot, J-M. et al. (Sep. 1998). "Approaches to Binaural Synthesis," Audio Engineering Society, 105th Conv., San Francisco, California, Sep. 26-29, 1998, 14 pages.
Jot, J-M. et al. (Sep. 20, 1999). "Interactive 3-D Audio Rendering Guidelines Level 2.0," Interactive Audio Special Interest Group, 29 pages.
Larcher, V. et al. (Feb. 2000). "Study and Comparison of Efficient Methods for 3D Audio Spatialization Based on Linear Decomposition of HRTF Data," Audio Engineering Society, 108th Conv., Paris, France, Feb. 19-22, 2000; 30 pages.
Larcher, V. et al. (Sep. 1998). "Equalization Methods in Binaural Technology," Audio Engineering Society, 105th Conv. San Francisco, California, Sep. 26-29, 1998, 29 pages.
Larcher, V. et al. (Sep. 2001). "Individualization of HRTF by Spectral Warping," International Congress on Acoustics, 3 pages.
Laroche, J. et al. (Apr. 1992). "Analysis/Synthese of Quasi-Harmonic Sounds by Use of the Karplus-Strong Algorithm," 2nd French Congress on Acoustics, Journal de Physique IV, Colloque C1, Supplement au Journal de Physique III, 2:C1-117-C1-120 (five pages.).
Marin, M. et al. (May 1994). "Environment de Simulation pour l'Evaluation Psychoacoustique des Systemes de Prise et de Restitution du Son dans un Contexte de Teleconference," 3rd French Congress on Acoustics, five pages.
Merimaa, J. et al. (Oct. 2007). "Correlation-Based Ambience Extraction from Stereo Recordings," Convention Paper 7282. Audio Eng. Society, 123rd Conv., New York, New York, Oct. 5-8, 2007, 15 pages.
Murgai, P. et al. (Oct. 2017). "Blind Estimation of the Reverberation Fingerprint of Unknown Acoustic Environments," Convention Paper 9905, Audio Engineering Society, 143rd Conv. New York, New York, Oct. 18-21, 2017, six pages.
Non-Final office action dated Jan. 23, 2020, for U.S. Appl. No. 16/427,315, filed May 30, 2019, fourteen pages.
Notice of Allowability dated Jan. 19, 2021, for U.S. Appl. No. 16/985,941, filed Aug. 5, 2020, 7 pages.
Notice of Allowance dated May 5, 2020, for U.S. Appl. No. 16/427,315, filed May 30, 2019, seven pages.
Notice of Allowance dated Sep. 3, 2020, for U.S. Appl. No. 16/985,941, filed Aug. 5, 2020, 8 pages.
Oliver, R. et al. (Oct. 2015). "Efficient Multi-Band Digital Audio Graphic Equalizer with Accurate Frequency Response Control," Convention Paper 9406, Audio Engineering Society, 139th Conv., New York, New York, Oct. 29-Nov. 1, 2015 11 pages.
Pernaux, J.-M. et al. (Nov. 1998). "Virtual Sound Source Positioning and Mixing in 5.1 Implementation on the Real-Time System Genesis," DAFx International Conf. Digital Audio Effects, five pages.
Thompson, J. et al. (Oct. 2012). "Direct-Diffuse Decomposition of Multichannel Signals Using a System of Pairwise Correlations," Convention Paper 8807, Audio Engineering Society, 133rd Conv. San Francisco, California, Oct. 26-29, 2012, 15 pages.
Trivi, J-M. et al. (Aug. 2002). "Rendering MPEG-4 AABIFS Content Through a Low-Level Cross-Platform 3D Audio API," IEEE ICME International Conf. Multimedia & Expo., pp. 513-516.
Vesa Valimaki et al.: 'All About Audio Equalization: Solutions and Frontiers'. ,Applied Sciences, vol. 6, No. 5, May 6, 2016 (May 6, 2016),p. 129, XP055615841,DOI : 10.3390/app6050129abstract; figures L-10Chapter 3, 3.1 to 3.5, 4, 4.L to 4.4.
Walsh, M. et al. (May 2011). "Adaptive Dynamics Enhancement," Convention Paper 8343, Audio Engineering Society, 130th Conv., London, UK May 13-16, 2011, 10 pages.
Walsh, M. et al. (Oct. 2006). "Loudspeaker-Based 3-D Audio System Design Using the M-S Shuffler Matrix," Convention Paper 6949, Audio Engineering Society, 121st. Conv., San Francisco, California, Oct. 5-8, 2006, 17 pages.

\* cited by examiner

| Frequency | Gain |
|---|---|
| $F_1$ | $G_1$ |
| $F_2$ | $G_2$ |
| $F_3$ | $G_3$ |
| $F_4$ | $G_4$ |
| $F_5$ | $G_5$ |
| $F_6$ | $G_6$ |
| $F_7$ | $G_7$ |
| $F_8$ | $G_8$ |
| $F_9$ | $G_9$ |
| $F_{10}$ | $G_{10}$ |
| $F_{11}$ | $G_{11}$ |
| $F_{12}$ | $G_{12}$ |

FIG. 9A

| Index | Frequency | Gain |
|-------|-----------|------|
| 1 | F1 | G1 |
| 2 | F2 | G2 |
| 3 | F3 | G3 |
| 4 | F4 | G4 |
| 5 | F5 | G5 |
| 6 | F6 | G6 |
| 7 | F7 | G7 |
| 8 | F8 | G8 |
| 9 | F9 | G9 |
| 10 | F10 | G10 |
| 11 | F11 | G11 |
| 12 | F12 | G12 |

FIG. 9B

| Index | Frequency | Gain |
|---|---|---|
| 1 | $F_1, F_{12}$ | $G_1$ |
| 2 | $F_2, F_{11}$ | $G_2$ |
| 3 | $F_3, F_{10}$ | $G_3$ |
| 4 | $F_4, F_9$ | $G_4$ |
| 5 | $F_5, F_8$ | $G_5$ |
| 6 | $F_6, F_7$ | $G_6$ |

FIG. 9C

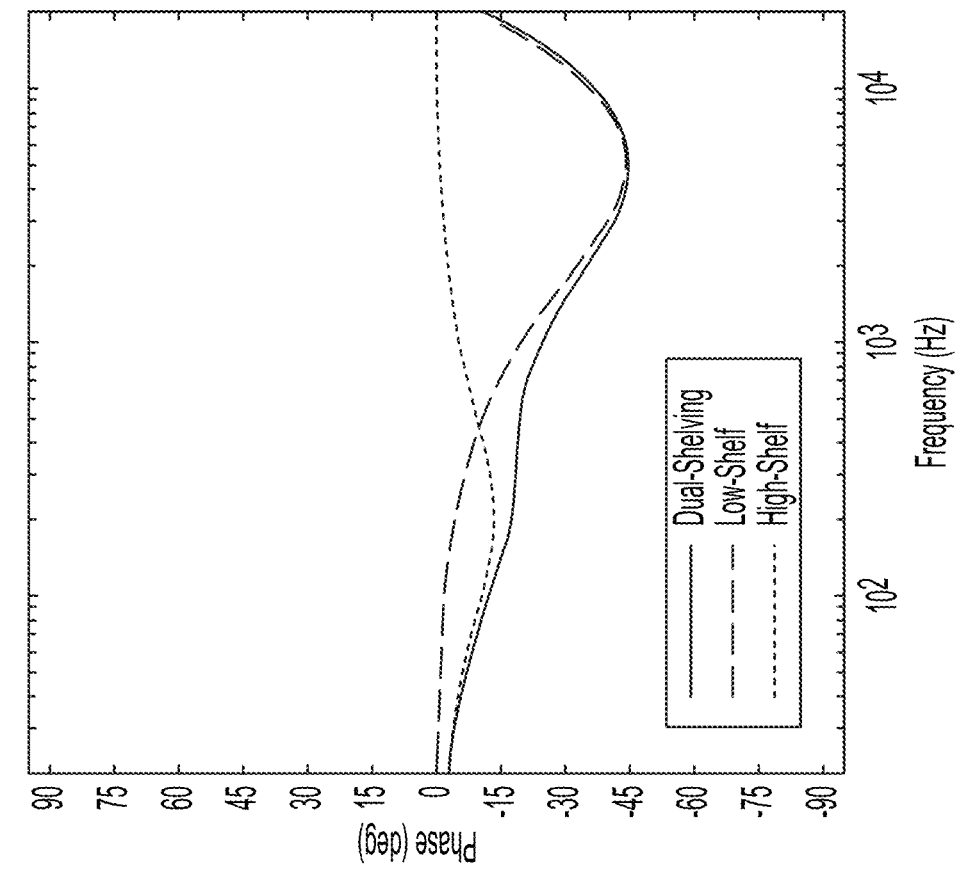
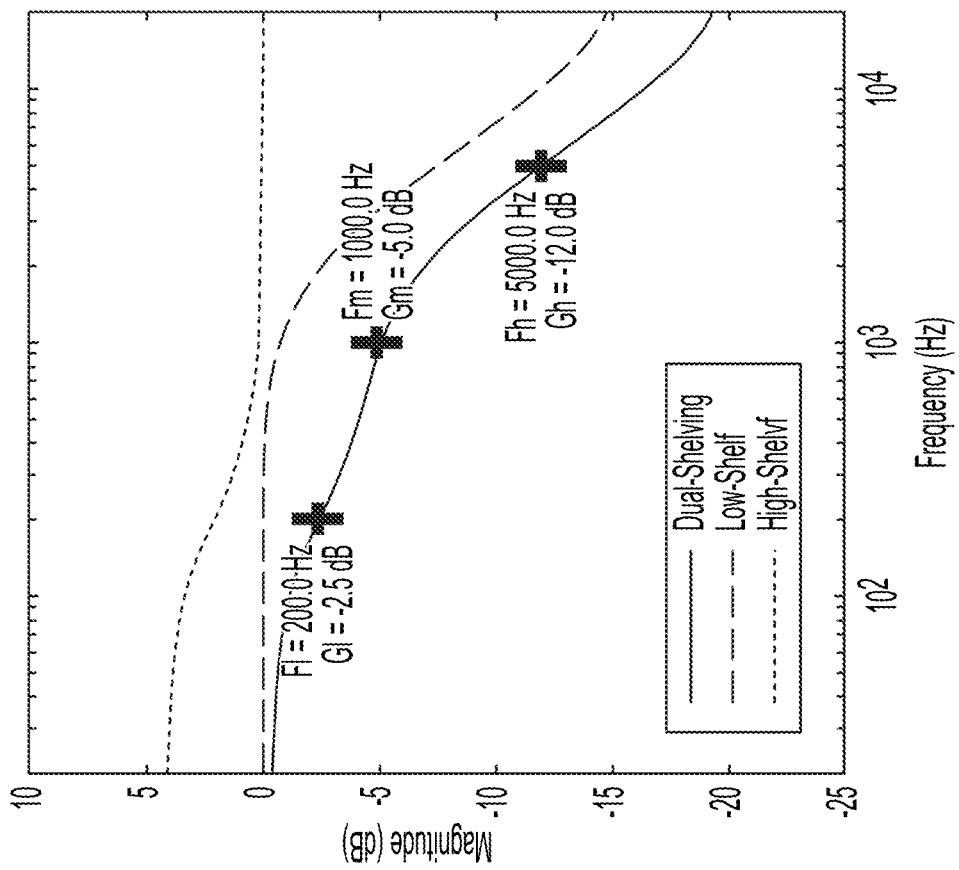
FIG. 11B
FIG. 11A

INDEX SCHEMING FOR FILTER PARAMETERS

REFERENCE TO RELATED APPLICATIONS

This application is a continuation of U.S. patent application Ser. No. 16/985,941, filed on Aug. 5, 2020, which is a continuation of U.S. patent application Ser. No. 16/427,315, filed on May 30, 2019, now U.S. Pat. No. 10,779,082, which claims benefit of U.S. Provisional Patent Application No. 62/678,259, filed on May 30, 2018, which are hereby incorporated by reference in their entirety.

FIELD

This disclosure relates in general to systems and methods for capturing, processing, and playing back audio signals, and in particular to systems and methods for capturing, processing, and playing back audio signals for presentation to a user in a virtual or augmented reality system.

BACKGROUND

Virtual environments are ubiquitous in computing environments, finding use in video games (in which a virtual environment may represent a game world); maps (in which a virtual environment may represent terrain to be navigated); simulations (in which a virtual environment may simulate a real environment); digital storytelling (in which virtual characters may interact with each other in a virtual environment); and many other applications. Modern computer users are generally comfortable perceiving, and interacting with, virtual environments. However, users' experiences with virtual environments can be limited by the technology for presenting virtual environments. For example, conventional displays (e.g., 2D display screens) and audio systems (e.g., fixed speakers) may be unable to realize a virtual environment in ways that create a compelling, realistic, and immersive experience.

Virtual reality ("VR"), augmented reality ("AR"), mixed reality ("MR"), and related technologies (collectively, "XR") share an ability to present, to a user of an XR system, sensory information corresponding to a virtual environment represented by data in a computer system. Such systems can offer a uniquely heightened sense of immersion and realism by combining virtual visual and audio cues with real sights and sounds. Accordingly, it can be desirable to present digital sounds to a user of an XR system in such a way that the sounds seem to be occurring—naturally, and consistently with the user's expectations of the sound—in the user's real environment. Generally speaking, users expect that virtual sounds will take on the acoustic properties of the real environment in which they are heard. For instance, a user of an XR system in a large concert hall will expect the virtual sounds of the XR system to have large, cavernous sonic qualities; conversely, a user in a small apartment will expect the sounds to be more dampened, close, and immediate. Additionally, users expect that virtual sounds will be presented without delays.

In order to meet these expectations, audio signals may need to be processed for accurate magnitude response control. One example mechanism used for audio signal processing is a proportional parametric equalizer (PPE). A PPE is capable of offering continuous control over parameters of an audio signal, and over the audio signal's frequency content. A PPE may be an efficient tool for accurate magnitude response control, within defined constraints. More specifically, a cascade of shelving filters can be used to create a multi-band (e.g., 3-band) parametric equalizer or tone control with minimal processing overhead. However, significant computing cycles and resources may be required to continually control such filters in an environment as dynamic as AR or dynamic spatialized audio capturing.

One way to determine the magnitude response of a prototype filter can be to apply the filter to a test signal and measure the output signal. Such approach may be prohibitive in terms of computing resources. Another way can be to pre-compute a filter's response and store it, e.g., in a lookup table. At run time, the data corresponding to a frequency of interest can be fetched from the storage. Although fetching information from storage may require very low computing costs, such costs add computational overhead every time new filter data is needed. Accordingly, magnitude response control to filter signals with increased efficiency is desired.

BRIEF SUMMARY

A system and method of processing an audio signal using a cascade of shelving filters to create a 3-band parametric equalizer is disclosed. In some embodiments, gain values derived from prototype filter parameters can be measured, and then a lookup table storing known gain values for designated filters can be used. The lookup table is accessed by a computing device, such as a head-mounted AR display device. Magnitude responses of this designated or prototype filter are also stored in the lookup table. The magnitude responses are retrieved and then applied and interpolated as needed for a particular combination of control frequencies in use by a user.

In some embodiments, an indexing scheme for the lookup table is used. The indexing scheme allows retrieval of filter data without having to search for the frequency of interest. The indexing scheme can be based on the prototype filter and its associated measured gain values. In some examples, in order to compute the filter parameters, the filter's magnitude response may be needed. An approximate response can be derived from the magnitude response of a corresponding prototype filter. The response of the prototype filter can then be modified to match desired filter parameters. The data relative to the control frequency of the prototype is indexed in the lookup table, where different values of the control frequency are offset and easy to retrieve.

BRIEF DESCRIPTION OF THE DRAWINGS

FIG. 9A illustrates an example lookup table including frequencies for a prototype filter and associated gain values, according to some embodiments.

FIG. 9B illustrates an example lookup table including indices and associated frequencies and gain values, according to some embodiments.

FIG. 9C illustrates an example lookup table including half the number of indices, according to some embodiments.

FIGS. 11A and 11B illustrate an exemplary magnitude response and an exemplary phase response, respectively, of a dual-shelving equalizer having a target magnitude response that monotonically decreases with frequency, according to some embodiments.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

U.S. patent application Ser. No. 15/907,155 is herein incorporated by reference in its entity incorporated by reference in its entirety.

Example Wearable System

Figure 1:
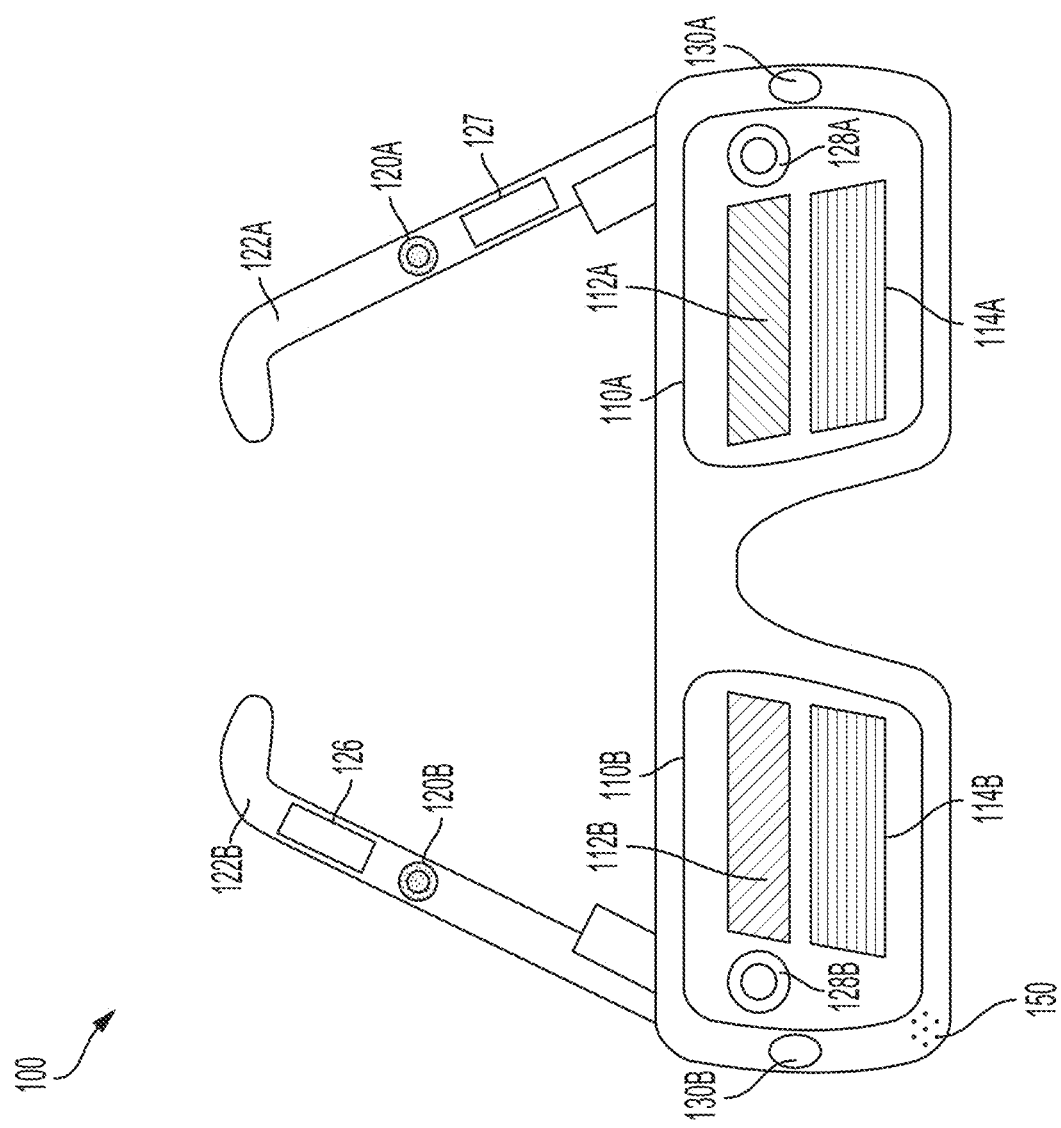
FIG. 1 illustrates an example wearable system, according to some embodiments.

FIG. 1 illustrates an example wearable head device 100 configured to be worn on the head of a user. Wearable head device 100 may be part of a broader wearable system that comprises one or more components, such as a head device (e.g., wearable head device 100), a handheld controller (e.g., handheld controller 200 described below), and/or an auxiliary unit (e.g., auxiliary unit 300 described below). In some examples, wearable head device 100 can be used for virtual reality, augmented reality, or mixed reality systems or applications. Wearable head device 100 can comprise one or more displays, such as displays 110A and 110B (which may comprise left and right transmissive displays, and associated components for coupling light from the displays to the user's eyes, such as orthogonal pupil expansion (OPE) grating sets 112A/112B and exit pupil expansion (EPE) grating sets 114A/114B); left and right acoustic structures, such as speakers 120A and 120B (which may be mounted on temple arms 122A and 122B, and positioned adjacent to the user's left and right ears, respectively); one or more sensors such as infrared sensors, accelerometers, GPS units, inertial measurement units (IMU)(e.g. IMU 126), acoustic sensors (e.g., microphone 150); orthogonal coil electromagnetic receivers (e.g., receiver 127 shown mounted to the left temple arm 122A); left and right cameras (e.g., depth (time-of-flight) cameras 130A and 130B) oriented away from the user; and left and right eye cameras oriented toward the user (e.g., for detecting the user's eye movements)(e.g., eye cameras 128 and 128B). However, wearable head device 100 can incorporate any suitable display technology, and any suitable number, type, or combination of sensors or other components without departing from the scope of the invention. In some examples, wearable head device 100 may incorporate one or more microphones 150 configured to detect audio signals generated by the user's voice; such microphones may be positioned in a wearable head device adjacent to the user's mouth. In some examples, wearable head device 100 may incorporate networking features (e.g., Wi-Fi capability) to communicate with other devices and systems, including other wearable systems. Wearable head device 100 may further include components such as a battery, a processor, a memory, a storage unit, or various input devices (e.g., buttons, touchpads); or may be coupled to a handheld controller (e.g., handheld controller 200) or an auxiliary unit (e.g., auxiliary unit 300) that comprises one or more such components. In some examples, sensors may be configured to output a set of coordinates of the head-mounted unit relative to the user's environment, and may provide input to a processor performing a Simultaneous Localization and Mapping (SLAM) procedure and/or a visual odometry algorithm. In some examples, wearable head device 100 may be coupled to a handheld controller 200, and/or an auxiliary unit 300, as described further below.

Figure 2:
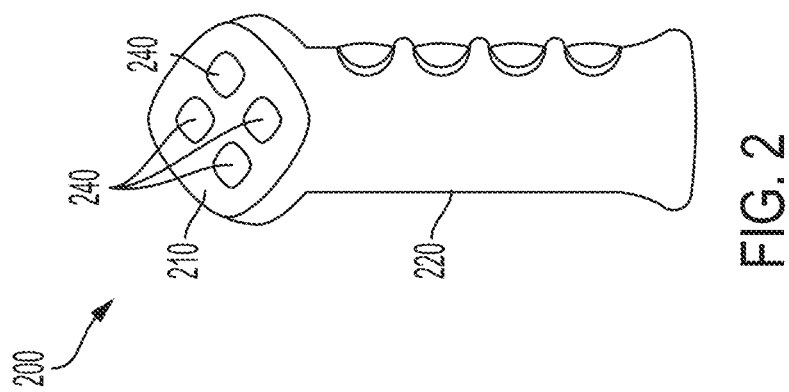
FIG. 2 illustrates an example handheld controller that can be used in conjunction with an example wearable system, according to some embodiments.

FIG. 2 illustrates an example mobile handheld controller component 200 of an example wearable system. In some examples, handheld controller 200 may be in wired or wireless communication with wearable head device 100 and/or auxiliary unit 300 described below. In some examples, handheld controller 200 includes a handle portion 220 to be held by a user, and one or more buttons 240 disposed along a top surface 210. In some examples, handheld controller 200 may be configured for use as an optical tracking target; for example, a sensor (e.g., a camera or other optical sensor) of wearable head device 100 can be configured to detect a position and/or orientation of handheld controller 200—which may, by extension, indicate a position and/or orientation of the hand of a user holding handheld controller 200. In some examples, handheld controller 200 may include a processor, a memory, a storage unit, a display, or one or more input devices, such as described above. In some examples, handheld controller 200 includes one or more sensors (e.g., any of the sensors or tracking components described above with respect to wearable head device 100). In some examples, sensors can detect a position or orientation of handheld controller 200 relative to wearable head device 100 or to another component of a wearable system. In some examples, sensors may be positioned in handle portion 220 of handheld controller 200, and/or may be mechanically coupled to the handheld controller. Handheld controller 200 can be configured to provide one or more output signals, corresponding, for example, to a pressed state of the buttons 240; or a position, orientation, and/or motion of the handheld controller 200 (e.g., via an IMU). Such output signals may be used as input to a processor of wearable head device 100, to auxiliary unit 300, or to another component of a wearable system. In some examples, handheld controller 200 can include one or more microphones to detect sounds (e.g., a user's speech, environmental sounds), and in some cases provide a signal corresponding to the detected sound to a processor (e.g., a processor of wearable head device 100).

Figure 3:
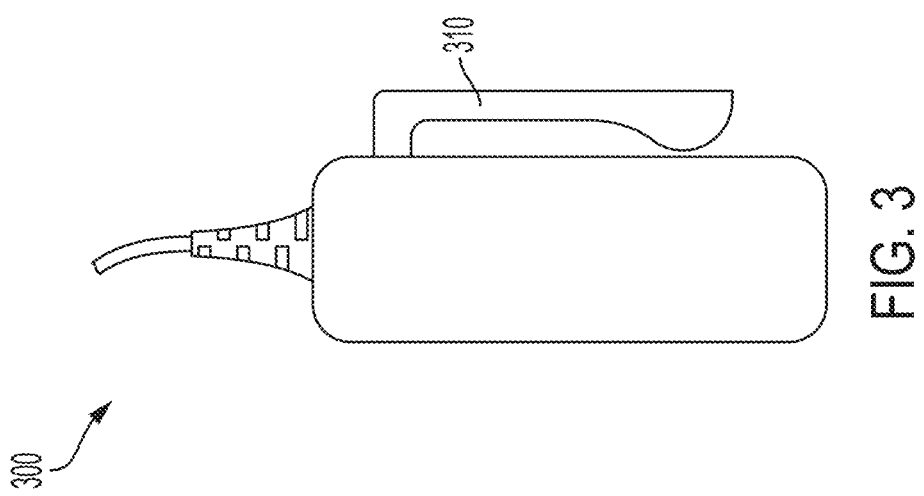
FIG. 3 illustrates an example auxiliary unit that can be used in conjunction with an example wearable system, according to some embodiments.

FIG. 3 illustrates an example auxiliary unit 300 of an example wearable system. In some examples, auxiliary unit 300 may be in wired or wireless communication with wearable head device 100 and/or handheld controller 200. The auxiliary unit 300 can include a battery to provide energy to operate one or more components of a wearable system, such as wearable head device 100 and/or handheld controller 200 (including displays, sensors, acoustic structures, processors, microphones, and/or other components of wearable head device 100 or handheld controller 200). In some examples, auxiliary unit 300 may include a processor, a memory, a storage unit, a display, one or more input devices, and/or one or more sensors, such as described above. In some examples, auxiliary unit 300 includes a clip 310 for attaching the auxiliary unit to a user (e.g., a belt worn by the user). An advantage of using auxiliary unit 300 to house one or more components of a wearable system is that doing so may allow large or heavy components to be carried on a user's waist, chest, or back—which are relatively well-suited to support large and heavy objects—rather than mounted to the user's head (e.g., if housed in wearable head device 100) or carried by the user's hand (e.g., if housed in handheld controller 200). This may be particularly advantageous for relatively heavy or bulky components, such as batteries.

Figure 4:
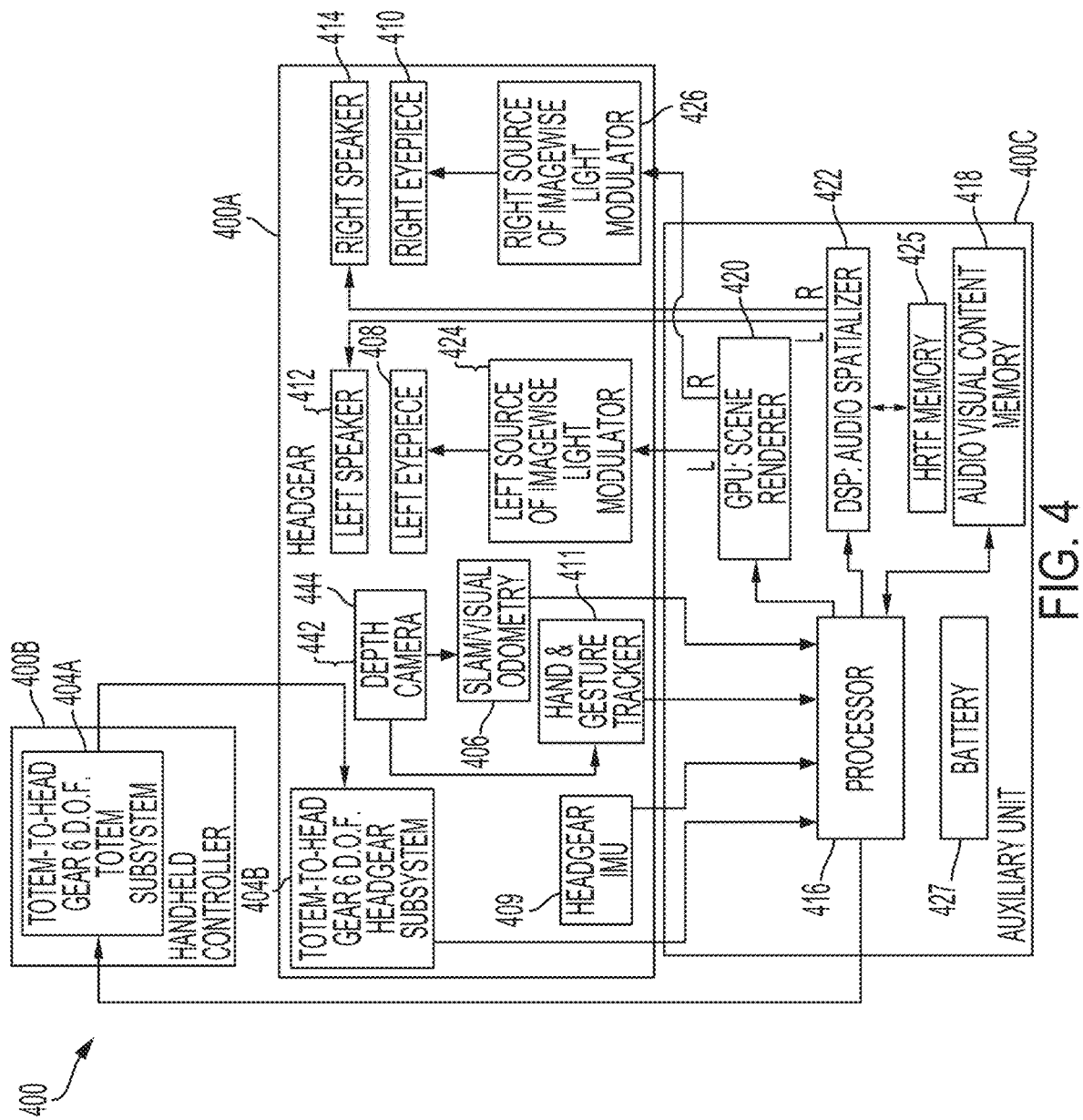
FIG. 4 illustrates an example functional block diagram for an example wearable system, according to some embodiments.

FIG. 4 shows an example functional block diagram that may correspond to an example wearable system 400, such as may include example wearable head device 100, handheld controller 200, and auxiliary unit 300 described above. In some examples, the wearable system 400 could be used for virtual reality, augmented reality, or mixed reality applications. As shown in FIG. 4, wearable system 400 can include example handheld controller 400B, referred to here as a "totem" (and which may correspond to handheld controller 200 described above); the handheld controller 400B can include a totem-to-headgear six degree of freedom (6DOF) totem subsystem 404A. Wearable system 400 can also include example wearable head device 400A (which may correspond to wearable headgear device 100 described above); the wearable head device 400A includes a totem-to-headgear 6DOF headgear subsystem 404B. In the example, the 6DOF totem subsystem 404A and the 6DOF headgear subsystem 404B cooperate to determine six coordinates (e.g., offsets in three translation directions and rotation along three axes) of the handheld controller 400B relative to the wearable head device 400A. The six degrees of freedom may be expressed relative to a coordinate system of the wearable head device 400A. The three translation offsets may be expressed as X, Y, and Z offsets in such a coordinate system, as a translation matrix, or as some other representation. The rotation degrees of freedom may be expressed as sequence of yaw, pitch, and roll rotations; as vectors; as a rotation matrix; as a quaternion; or as some other representation. In some examples, one or more depth cameras 444 (and/or one or more non-depth cameras) included in the wearable head device 400A; and/or one or more optical targets (e.g., buttons 240 of handheld controller 200 as described above, or dedicated optical targets included in the handheld controller) can be used for 6DOF tracking. In some examples, the handheld controller 400B can include a camera, as described above; and the headgear 400A can include an optical target for optical tracking in conjunction with the camera. In some examples, the wearable head device 400A and the handheld controller 400B each include a set of three orthogonally oriented solenoids which are used to wirelessly send and receive three distinguishable signals. By measuring the relative magnitude of the three distinguishable signals received in each of the coils used for receiving, the 6DOF of the handheld controller 400B relative to the wearable head device 400A may be determined. In some examples, 6DOF totem subsystem 404A can include an Inertial Measurement Unit (IMU) that is useful to provide improved accuracy and/or more timely information on rapid movements of the handheld controller 400B.

In some examples involving augmented reality or mixed reality applications, it may be desirable to transform coordinates from a local coordinate space (e.g., a coordinate space fixed relative to wearable head device 400A) to an inertial coordinate space, or to an environmental coordinate space. For instance, such transformations may be necessary for a display of wearable head device 400A to present a virtual object at an expected position and orientation relative to the real environment (e.g., a virtual person sitting in a real chair, facing forward, regardless of the position and orientation of wearable head device 400A), rather than at a fixed position and orientation on the display (e.g., at the same position in the display of wearable head device 400A). This can maintain an illusion that the virtual object exists in the real environment (and does not, for example, appear positioned unnaturally in the real environment as the wearable head device 400A shifts and rotates). In some examples, a compensatory transformation between coordinate spaces can be determined by processing imagery from the depth cameras 444 (e.g., using a Simultaneous Localization and Mapping (SLAM) and/or visual odometry procedure) in order to determine the transformation of the wearable head device 400A relative to an inertial or environmental coordinate system. In the example shown in FIG. 4, the depth cameras 444 can be coupled to a SLAM/visual odometry block 406 and can provide imagery to block 406. The SLAM/visual odometry block 406 implementation can include a processor configured to process this imagery and determine a position and orientation of the user's head, which can then be used to identify a transformation between a head coordinate space and a real coordinate space. Similarly, in some examples, an additional source of information on the user's head pose and location is obtained from an IMU 409 of wearable head device 400A. Information from the IMU 409 can be integrated with information from the SLAM/visual odometry block 406 to provide improved accuracy and/or more timely information on rapid adjustments of the user's head pose and position.

In some examples, the depth cameras 444 can supply 3D imagery to a hand gesture tracker 411, which may be implemented in a processor of wearable head device 400A. The hand gesture tracker 411 can identify a user's hand gestures, for example, by matching 3D imagery received from the depth cameras 444 to stored patterns representing hand gestures. Other suitable techniques of identifying a user's hand gestures will be apparent.

In some examples, one or more processors 416 may be configured to receive data from headgear subsystem 404B, the IMU 409, the SLAM/visual odometry block 406, depth cameras 444, a microphone (not shown); and/or the hand gesture tracker 411. The processor 416 can also send and receive control signals from the 6DOF totem system 404A. The processor 416 may be coupled to the 6DOF totem system 404A wirelessly, such as in examples where the handheld controller 400B is untethered. Processor 416 may further communicate with additional components, such as an audio-visual content memory 418, a Graphical Processing Unit (GPU) 420, and/or a Digital Signal Processor (DSP) audio spatializer 422. The DSP audio spatializer 422 may be coupled to a Head Related Transfer Function (HRTF) memory 425. The GPU 420 can include a left channel output coupled to the left source of imagewise modulated light 424 and a right channel output coupled to the right source of imagewise modulated light 426. GPU 420 can output stereoscopic image data to the sources of imagewise modulated light 424, 426. The DSP audio spatializer 422 can output audio to a left speaker 412 and/or a right speaker 414. The DSP audio spatializer 422 can receive input from processor 416 indicating a direction vector from a user to a virtual sound source (which may be moved by the user, e.g., via the handheld controller 400B). Based on the direction vector, the DSP audio spatializer 422 can determine a corresponding HRTF (e.g., by accessing a HRTF, or by interpolating multiple HRTFs). The DSP audio spatializer 422 can then apply the determined HRTF to an audio signal, such as an audio signal corresponding to a virtual sound generated by a virtual object. This can enhance the believability and realism of the virtual sound, by incorporating the relative position and orientation of the user relative to the virtual sound in the mixed reality environment—that is, by presenting a virtual sound that matches a user's expectations of what that virtual sound would sound like if it were a real sound in a real environment.

In some examples, such as shown in FIG. 4, one or more of processor 416, GPU 420, DSP audio spatializer 422, HRTF memory 425, and audio/visual content memory 418 may be included in an auxiliary unit 400C (which may correspond to auxiliary unit 300 described above). The auxiliary unit 400C may include a battery 427 to power its components and/or to supply power to wearable head device 400A and/or handheld controller 400B. Including such components in an auxiliary unit, which can be mounted to a user's waist, can limit the size and weight of wearable head device 400A, which can in turn reduce fatigue of a user's head and neck.

While FIG. 4 presents elements corresponding to various components of an example wearable system 400, various other suitable arrangements of these components will become apparent to those skilled in the art. For example, elements presented in FIG. 4 as being associated with auxiliary unit 400C could instead be associated with wearable head device 400A or handheld controller 400B. Furthermore, some wearable systems may forgo entirely a handheld controller 400B or auxiliary unit 400C. Such changes and modifications are to be understood as being included within the scope of the disclosed examples.

Mixed Reality Environment

Like all people, a user of a mixed reality system exists in a real environment—that is, a three-dimensional portion of the "real world," and all of its contents, that are perceptible by the user. For example, a user perceives a real environment using one's ordinary human senses sight, sound, touch, taste, smell—and interacts with the real environment by moving one's own body in the real environment. Locations in a real environment can be described as coordinates in a coordinate space; for example, a coordinate can comprise latitude, longitude, and elevation with respect to sea level; distances in three orthogonal dimensions from a reference point; or other suitable values. Likewise, a vector can describe a quantity having a direction and a magnitude in the coordinate space.

A computing device can maintain, for example in a memory associated with the device, a representation of a virtual environment. As used herein, a virtual environment is a computational representation of a three-dimensional space. A virtual environment can include representations of any object, action, signal, parameter, coordinate, vector, or other characteristic associated with that space. In some examples, circuitry (e.g., a processor) of a computing device can maintain and update a state of a virtual environment; that is, a processor can determine at a first time, based on data associated with the virtual environment and/or input provided by a user, a state of the virtual environment at a second time. For instance, if an object in the virtual environment is located at a first coordinate at time, and has certain programmed physical parameters (e.g., mass, coefficient of friction); and an input received from user indicates that a force should be applied to the object in a direction vector; the processor can apply laws of kinematics to determine a location of the object at time using basic mechanics. The processor can use any suitable information known about the virtual environment, and/or any suitable input, to determine a state of the virtual environment at a time. In maintaining and updating a state of a virtual environment, the processor can execute any suitable software, including software relating to the creation and deletion of virtual objects in the virtual environment; software (e.g., scripts) for defining behavior of virtual objects or characters in the virtual environment; software for defining the behavior of signals (e.g., audio signals) in the virtual environment; software for creating and updating parameters associated with the virtual environment; software for generating audio signals in the virtual environment; software for handling input and output; software for implementing network operations; software for applying asset data (e.g., animation data to move a virtual object over time); or many other possibilities.

Output devices, such as a display or a speaker, can present any or all aspects of a virtual environment to a user. For example, a virtual environment may include virtual objects (which may include representations of inanimate objects; people; animals; lights; etc.) that may be presented to a user. A processor can determine a view of the virtual environment (for example, corresponding to a "camera" with an origin coordinate, a view axis, and a frustum); and render, to a display, a viewable scene of the virtual environment corresponding to that view. Any suitable rendering technology may be used for this purpose. In some examples, the viewable scene may include only some virtual objects in the virtual environment, and exclude certain other virtual objects. Similarly, a virtual environment may include audio aspects that may be presented to a user as one or more audio signals. For instance, a virtual object in the virtual environment may generate a sound originating from a location coordinate of the object (e.g., a virtual character may speak or cause a sound effect); or the virtual environment may be associated with musical cues or ambient sounds that may or may not be associated with a particular location. A processor can determine an audio signal corresponding to a "listener" coordinate—for instance, an audio signal corresponding to a composite of sounds in the virtual environment, and mixed and processed to simulate an audio signal that would be heard by a listener at the listener coordinate—and present the audio signal to a user via one or more speakers.

Because a virtual environment exists only as a computational structure, a user cannot directly perceive a virtual environment using one's ordinary senses. Instead, a user can perceive a virtual environment only indirectly, as presented to the user, for example by a display, speakers, haptic output devices, etc. Similarly, a user cannot directly touch, manipulate, or otherwise interact with a virtual environment; but can provide input data, via input devices or sensors, to a processor that can use the device or sensor data to update the virtual environment. For example, a camera sensor can provide optical data indicating that a user is trying to move an object in a virtual environment, and a processor can use that data to cause the object to respond accordingly in the virtual environment.

Digital Reverberation and Environmental Audio Processing

A XR system can present audio signals that appear, to a user, to originate at a sound source with an origin coordinate, and travel in a direction of an orientation vector in the system. The user may perceive these audio signals as if they were real audio signals originating from the origin coordinate of the sound source and traveling along the orientation vector.

In some cases, audio signals may be considered virtual in that they correspond to computational signals in a virtual environment, and do not necessarily correspond to real sounds in the real environment. However, virtual audio signals can be presented to a user as real audio signals detectable by the human ear, for example as generated via speakers 120A and 120B of wearable head device 100 in FIG. 1.

Some virtual or mixed reality environments suffer from a perception that the environments do not feel real or authentic. One reason for this perception is that audio and visual cues do not always match each other in virtual environments. The entire virtual experience may feel fake and inauthentic, in part because it does not comport with our own expectations based on real world interactions. It is desirable to improve the user's experience by presenting audio signals that appear to realistically interact—even in subtle ways—with objects in the user's environment. The more consistent such audio signals are with our own expectations, based on real world experience, the more immersive and engaging the user's experience will be.

As discussed above, a processor can determine an audio signal corresponding to a composite of sounds in the virtual environment. The composite of sounds can be generated based on the properties of the user's current environment. Exemplary properties include, but are not limited to, size, shape, materials, and acoustic character. For example, brick walls may cause different sounds than glass walls. As another example, the acoustic character of the sounds may differ when a couch is located in the current environment relative to when the couch is absent. The processor may use information (e.g., one or more properties) about the user's current environment to set various parameters for the audio signal processing discussed in detail below. The parameter(s) can be used to determine information from the lookup table. Advantages to the below disclosed embodiments include reduced memory requirements, reduced network bandwidth, reduced power consumption, reduced computational complexity, and reduced computational delays. These advantages may be particularly significant to mobile systems, including wearable systems, where processing resources, networking resources, battery capacity, and physical size and heft are often at a premium.

In some embodiments, the processor may determine the parameters dynamically (e.g., computes an impulse response on the fly). For example, the system may store one or more predetermined signals in memory. The wearable head unit may generate a test audio signal and determine its response within the user's current environment, for example via sensors of the wearable head unit. The response may be a reflected audio signal that has propagated through the user's current environment, for example. The processor may determine the parameters based on changes between the test audio signal and the reflected audio signal. The reflected audio signal may be in response to the generated test audio signal.

In some embodiments, the processor may determine the parameters based on one or more actions of the user. For example, the processor may determine, using the sensors on the wearable head device, whether the user has changed their gaze target, whether the user has changed their vital signs, etc. The processor may use the determined sensor information to determine which parameters in the current environment would result in the user's action.

In an environment as dynamic as AR, the filters used for audio signal processing must be continuously controlled. The continuous control can be achieved using PPEs, and more specifically, a cascade of shelving filters that creates a 3-band parametric equalizer or tone control with minimal processing overhead.

The system may use a second order infinite impulse response (IIR) filter topology that facilitates parameter equalization. One such topology is a Regalia-Mitra topology. The Regalia-Mitra topology may be modified to obtain parametric shelving filters with "mutually homothetic" responses for a given value of a control frequency ω.

In some examples, an accurate 3-band parametric equalizer (e.g., bass/mid/treble) may be formed by cascading two proportional shelving filters. Cascading two filters may be equivalent to using one filter whose gain k is the product of the gains of the two filters. One filter may be a parametric low-shelving equalizer, and the other filter may be a parametric high-shelving equalizer. Cascading the low-shelving equalizer with the high-shelving equalizer can result in a dual-shelving equalizer. The dual-shelving equalizer may have adjustable cross-over frequencies and may be efficiently implemented as a biquadratic IIR filter.

Example Implementation

Figure 5:
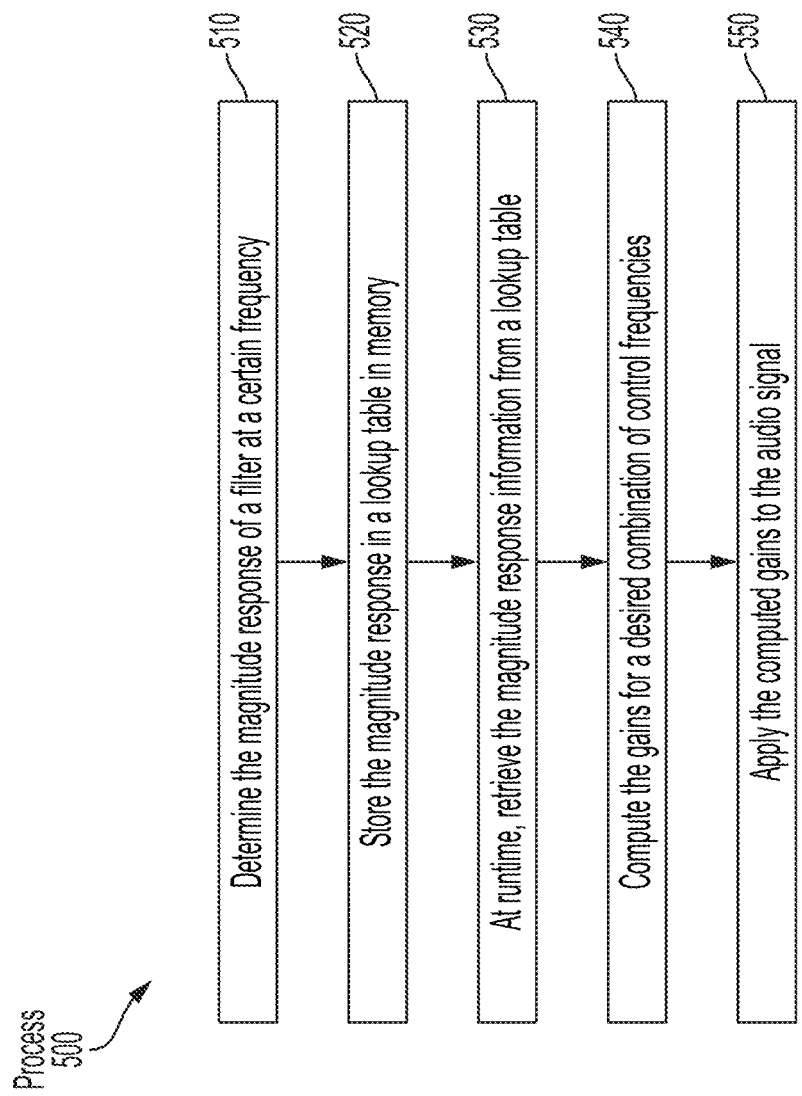
FIG. 5 illustrates an example process that may be executed by an XR system, according to some embodiments.

FIG. 5 illustrates an example process 500 that may be executed by an XR system, such as by one or more processors of the XR system. Example process 500 uses a prototype filter to determine the parametric filter parameters, a lookup table to store corresponding gain values, and an indexing scheme to efficiently retrieve the gain information from the lookup table. Once the gain information is obtained from the lookup table, data (e.g., gain values) for the control frequency are computed. Each step is discussed in further detail below and illustrated by way of non-limiting examples.

At step 510, the system determines the magnitude response of a filter at a certain frequency. In some embodiments, this step includes computing the magnitude response of one or more filters. The filter(s) can be two separate filters such as a low-shelving equalizer and a high-shelving equalizer. As discussed above, the low-shelving equalizer can have a control frequency $F_l$, and the high-shelving equalizer can have a control frequency $F_h$.

In some embodiments, the magnitude response of a first filter can be determined (e.g., approximately derived) from the magnitude response of a second filter. This determination can include scaling the magnitude response information (e.g., gains) of the second filter and shifting the data (e.g., scaled magnitude response information) along the frequency axis by a predetermined frequency amount. The predetermined frequency amount can be the amount needed to match the scaled magnitude response information of the second filter to the first filter.

In some embodiments, the filters may be symmetrical. As such, the magnitude response of a first filter (e.g., a high-shelving equalizer) can be determined by flipping the magnitude response of a second filter (e.g., a low-shelving equalizer) along a frequency axis. Examples of the disclosure further include the first filter being the low-shelving equalizer and the second filter being the high-shelving equalizer.

In some embodiments, the frequency response of a prototype filter can be pre-computed. The corresponding magnitude response can also be pre-computed and stored in memory (step 520). The magnitude response, along with other information such as the frequency values and associated gain values, can be stored in a lookup table.

At step 530, at runtime, the system retrieves the magnitude response information from the lookup table. At step 540, the system uses this magnitude response information to compute the gains $G_{hl}$, $G_{hm}$, $G_{lm}$, and $G_{lh}$ for a desired combination of control frequencies $F_l$, $F_m$, and $F_h$. Then, the system can process the audio signal by implementing the filters and applying the computed gains to the audio signal (step 550). In some embodiments, process 500 can include an additional step of sending the processed audio signal to a wearable head device.

Example Magnitude Response Determination

For example purposes only, a prototype filter with a control frequency of 640 Hz may be selected. One advantage to a 640 Hz control frequency can be its applicability for audio applications. 640 Hz it is approximately halfway between 20 Hz and 20 kHz on a log scale, which spans the useful human hearing range. Another advantage to a 640 Hz control frequency can be that it is far enough from DC and Nyquist to avoid warping issues (assuming 44.1 kHz or 48 kHz sample rate). Examples of the disclosure include control frequencies other than 640 Hz.

Figure 6:
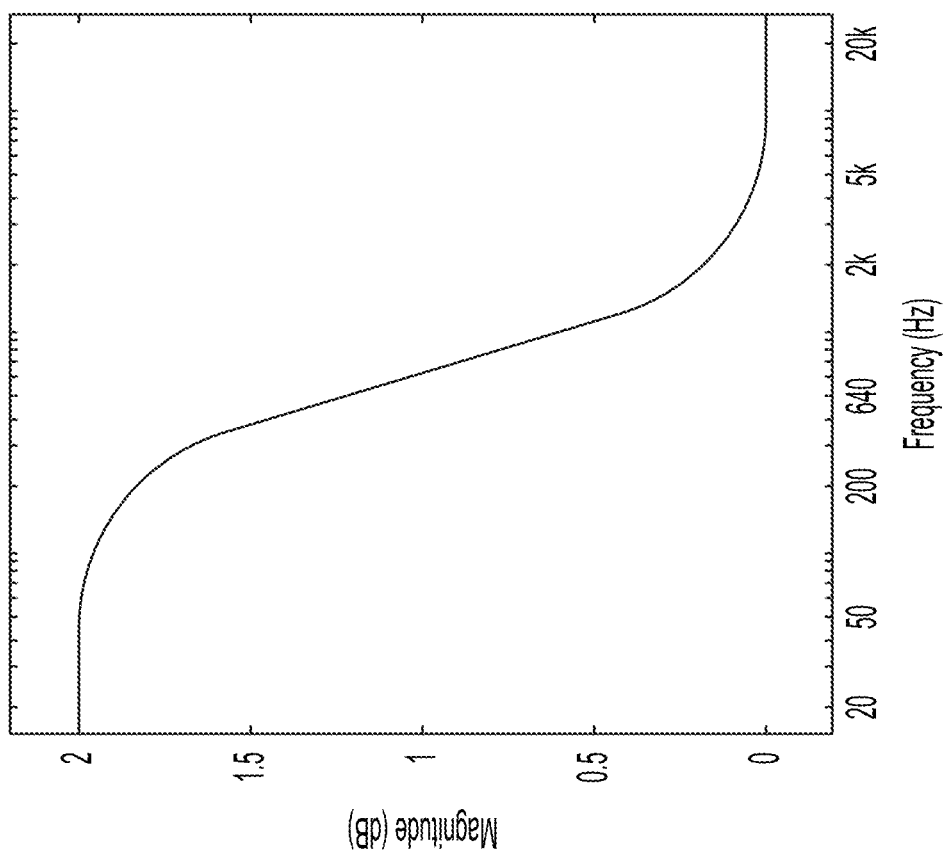
FIG. 6 illustrates a magnitude response of an example low-shelving prototype filter, according to some embodiments.

FIG. 6 illustrates a magnitude response of an example low-shelving prototype filter. The thin vertical lines show the sampling frequency points. The sampling frequency points can be equally spaced entries in a lookup table. For example, the sampling frequency points may have $12^{th}$-octave spacing. As used throughout this disclosure, the term "filter gains" refers to the gains at the control frequencies. In some instances, the low-shelving prototype filter may have a gain of 1 dB at the control frequency of 640 Hz and a gain of 2 dB at DC, as shown in the figure.

In some embodiments, the magnitude response of the prototype filter at those $12^{th}$-octave frequency points may be stored in a lookup table (step 520).

In some instances, this lookup table may later be used (step 530) for a filter with a control frequency close to DC or Nyquist. The data from the magnitude response determination may not cover a wide enough frequency range. In some embodiments, the system may set the magnitude response of such a filter to be equal to a saturation value. For example, the saturation value may be 2 dB when the control frequency is below 20 Hz or 0 dB when the control frequency is above 20 kHz. This assumed information may be stored in the lookup table (at step 520). Alternatively, the system may determine that the control frequency is outside a threshold range for the lookup table and may use assumed information as a result of the determination.

Figure 7A:
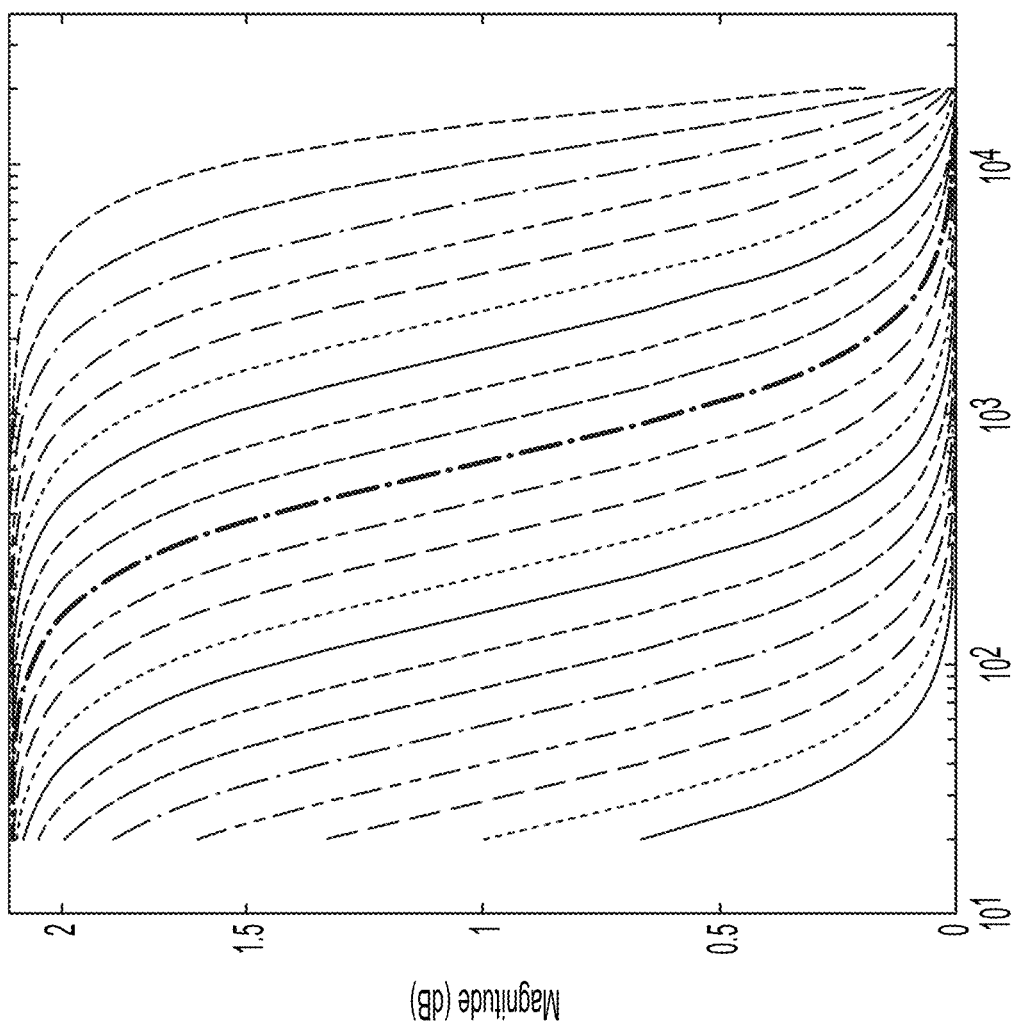
FIG. 7A illustrates a measured magnitude response of an example low-shelving equalizer, according to some embodiments.
Figure 7B:
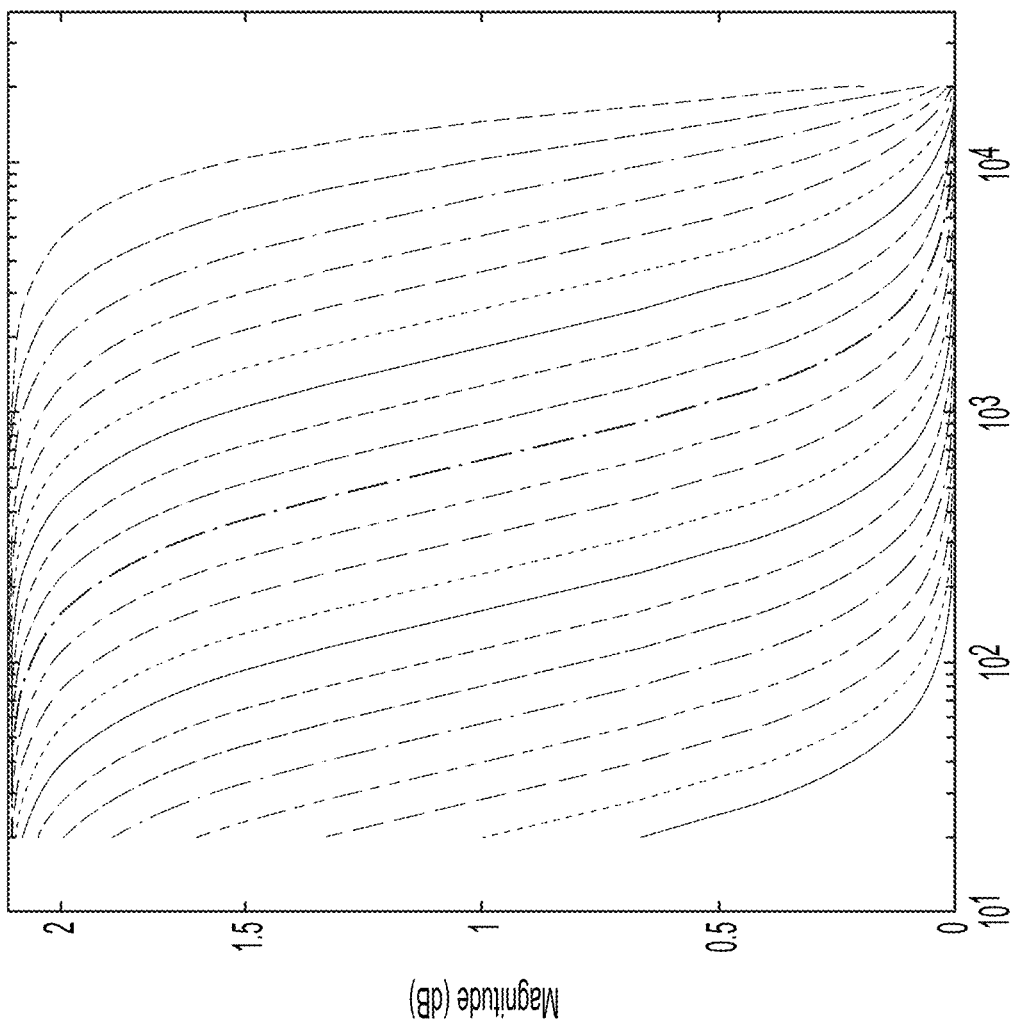
FIG. 7B illustrates an approximated magnitude response of the example low-shelving equalizer, according to some embodiments.
Figure 7C:
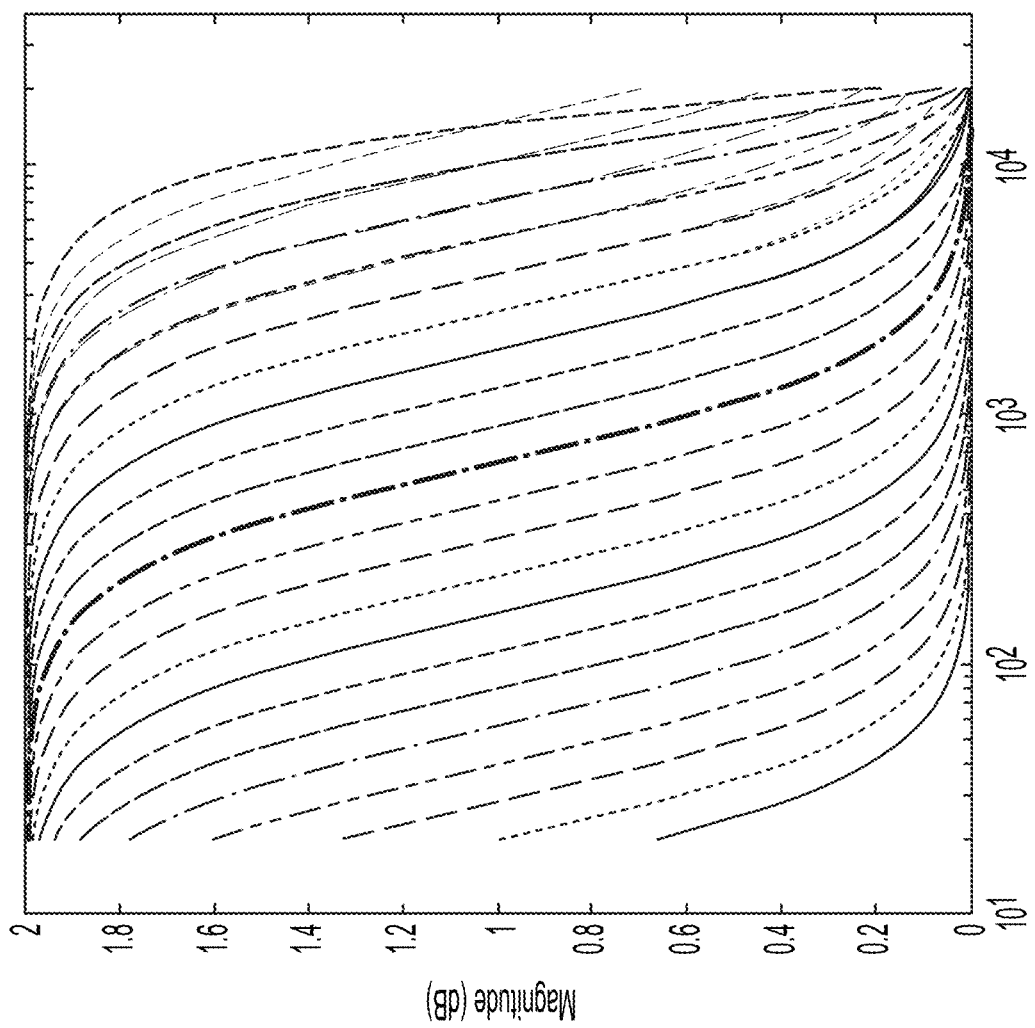
FIG. 7C illustrates FIG. 7A overlaid on FIG. 7B, according to some embodiments.

FIG. 7A illustrates the measured magnitude response of an example low-shelving equalizer, and FIG. 7B illustrates the approximated magnitude response of the example low-shelving equalizer. FIG. 7C illustrates FIG. 7A overlaid on FIG. 7B. The approximated magnitude response shown in FIG. 7B can be obtained by shifting the prototype filter by a predetermined frequency amount along the frequency axis. As shown in the figures, the prototype filter can provide a very good approximation. In some examples, there may be an approximation error for the low-shelving equalizer when the control frequency approaches Nyquist. In some instances, the approximation error may not affect performance because it may be unlikely that the control frequency $F_l$ is close to Nyquist. (Generally speaking, $F_l$ is lower than $F_m$, and $F_m$ is lower than $F_h$.)

Figure 8A:
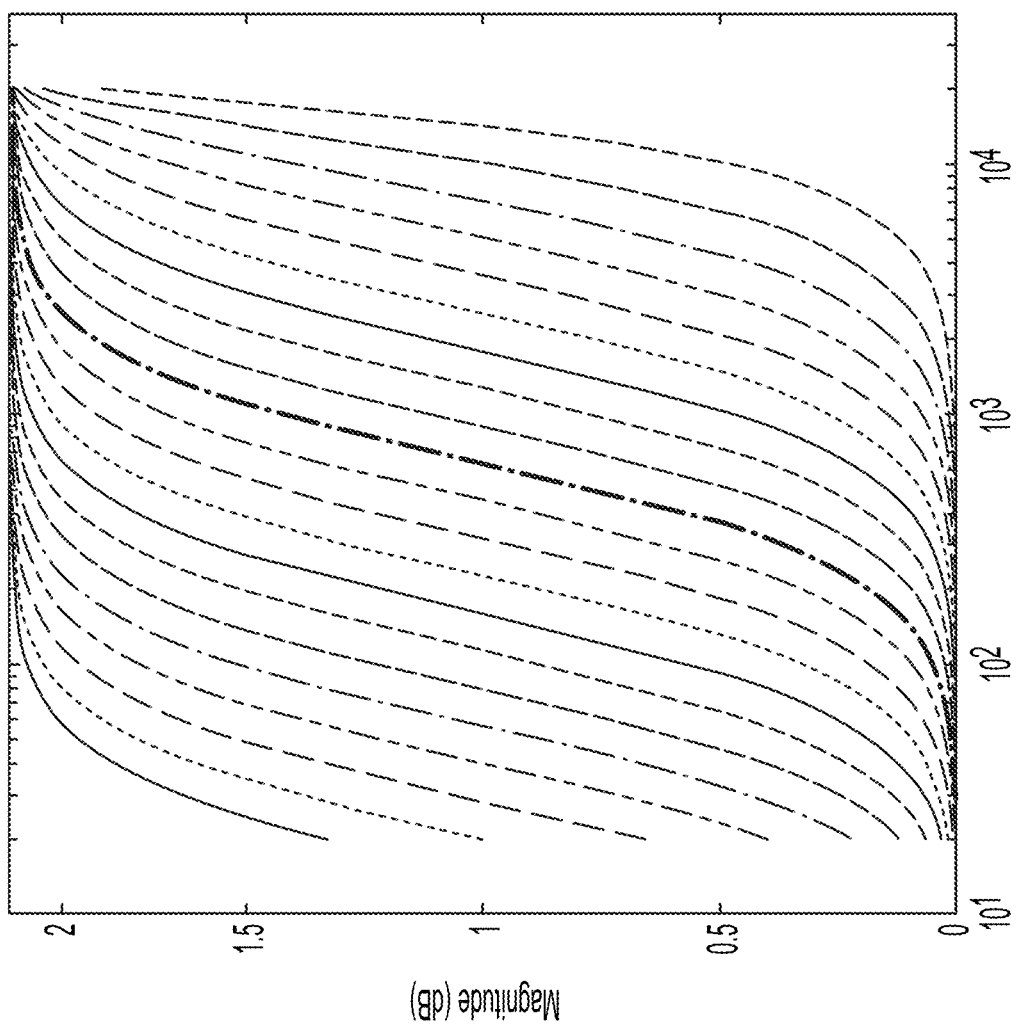
FIG. 8A illustrates a measured magnitude response of an example high-shelving equalizer, according to some embodiments.
Figure 8B:
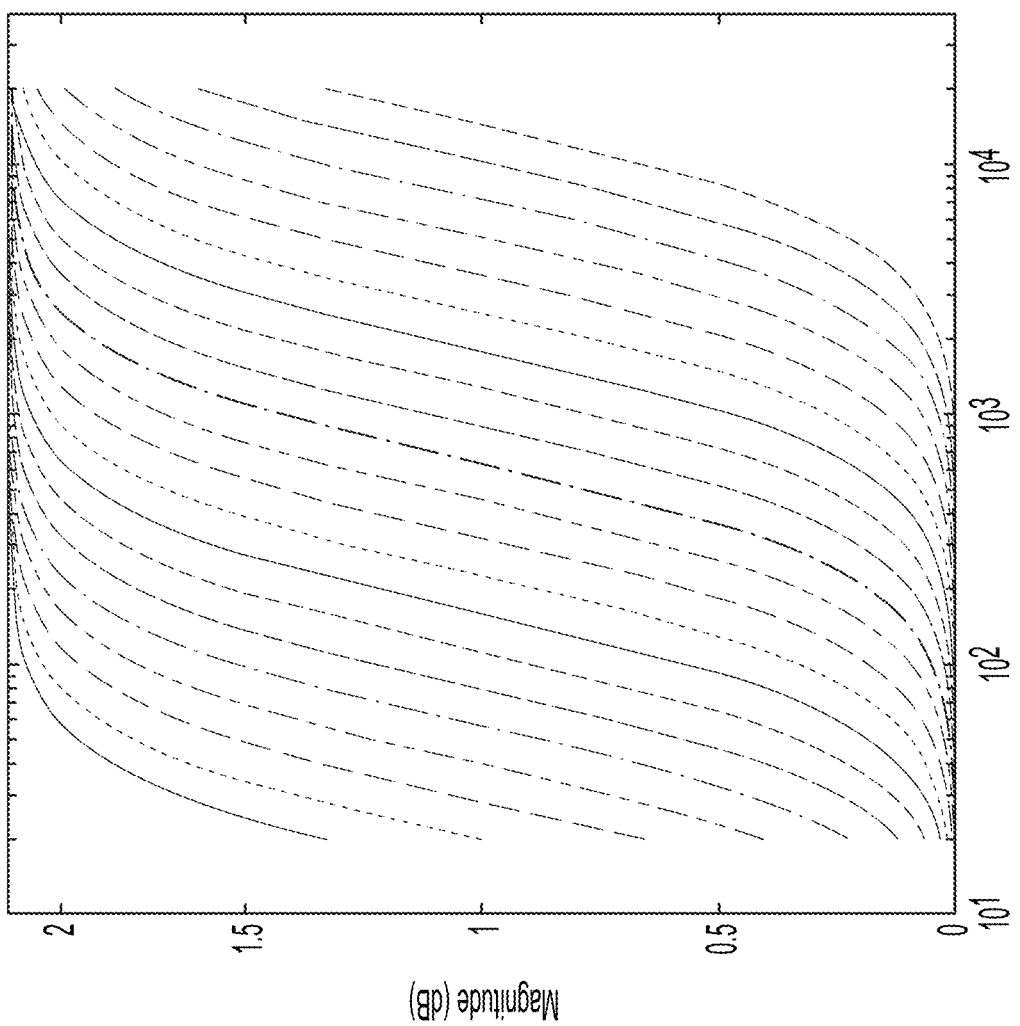
FIG. 8B illustrates an approximated magnitude response of the example high-shelving equalizer, according to some embodiments.
Figure 8C:
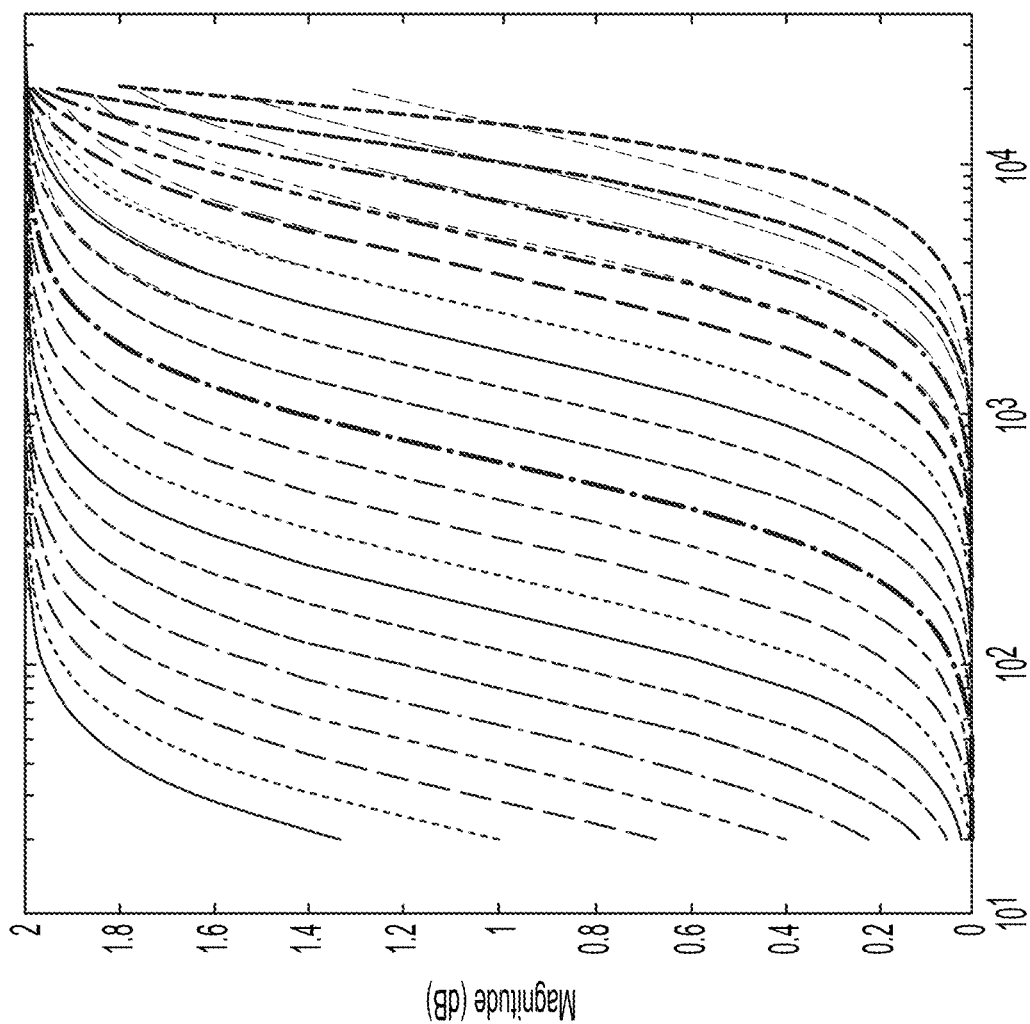
FIG. 8C illustrates FIG. 8A overlaid on FIG. 8B, according to some embodiments.

FIG. 8A illustrates the measured magnitude response of an example high-shelving equalizer, and FIG. 8B illustrates the approximated magnitude response of the example high-shelving equalizer. FIG. 8C illustrates FIG. 8A overlaid on FIG. 8B. The approximated magnitude response shown in FIG. 8B can be obtained by shifting the prototype filter along the frequency axis. As shown in the figures, the prototype filter can provide a very good approximation. In some examples, there may be an approximation error for the high-shelving equalizer that affects that computation of two gains: $G_{hl}$ and $G_{hm}$. The approximation error may be noticeable if the control frequencies $F_h$, $F_l$, and $F_m$ are set fairly high (e.g., above 2 kHz).

Lookup Table and Indexing Scheme

As discussed above, in step 520, the magnitude response at a given frequency can be stored in a lookup table. The magnitude response can be indicative of the associated gain values of the prototype filter. FIG. 9A illustrates an example lookup table including frequencies for a prototype filter and associated gain values. Returning to the previous example of the magnitude response having $12^{th}$-octave spacing, the lookup table can include an entry for each sampling frequency point. For example, as shown in the figure, frequency $F_1$ can have an associated gain $G_1$ stored in the table; frequency $F_2$ can have an associated gain $G_2$ stored in the table; frequency $F_{12}$ can have an associated gain $G_{12}$ stored in the table; etc. In this manner, the system may, at step 530, retrieve the corresponding gain value from the lookup table for a given frequency point of interest.

In some embodiments, the system can retrieve gain information using an index. The index of each frequency and corresponding gain value can be stored in the lookup table. FIG. 9B illustrates an example lookup table including indices and associated frequencies and gain values. Returning to the previous example of the magnitude response having $12^{th}$-octave spacing, the lookup table can include an index for each sampling frequency point. The relationship between the indices $id_{F2}$ and $id_{F1}$ of any two frequency points (e.g., frequency points $F_1$ and $F_2$) can be expressed as:

$$id_{F2} = \left[12 * \log\frac{F_2}{F_1} \middle/ \log(2)\right] + id_{F1} \quad (1)$$

Therefore, gains may be accessed from the table (in FIG. 9B) by using Equation (1) to compute the relative index. For example, $G_{lm}$ (the dB gain of the low-shelving equalizer at $F_m$, when its gain is set to +1 dB) may be derived by computing its index:

$$id_{Glm} = \left\lfloor 12 * \log \frac{F_m}{F_l} \middle/ \log(2) \right\rfloor + id_{Fcp} \qquad (2)$$

where $id_{Fcp}$ is the index of the control frequency in the lookup table. In some embodiments, the index in the lookup table may be an integer value, as shown in the figure. As one example, frequency $F_6$ in the table of FIG. 9B may be 640 Hz, which may correspond to index 6.

In some embodiments, the index relationship may be generalized to a prototype filter sampled on a $n^{th}$-octave spacing. The index relationship can be expressed as:

$$id_F = \left\lfloor n * \mathrm{loglog}\left(\frac{F}{F_c}\right) \middle/ \log(2) \right\rfloor + id_{FC} \qquad (3)$$

In some embodiments, the lookup table of FIG. 9B can be used for multiple filters, such as the low-shelving filter and the high-shelving filter. For example, the lookup table can store values from the low-shelving filter, and the high-shelving filter response can be obtained by flipping the prototype filter data along the frequency axis. For instances, the index of $G_{hl}$ can be computed as:

$$id_{Ghl} = id_{Fcp} - \left\lfloor 12 * \log\left(\frac{F_l}{F_h}\right) \middle/ \log(2) \right\rfloor \qquad (4)$$

In some embodiments, the lookup table can include half as many indices used for the retrieval of the magnitude response information. Returning to the previous example of the magnitude response having $12^{th}$-octave spacing, the lookup table can include half (e.g., six) indices. The six indices can store the magnitude response information for the first filter (e.g., low-shelving filter). The magnitude response information for the second filter (e.g., high-shelving filter) can be obtained by using the information from the first filter, stored in the table, by using Equation (4). In this manner, each index in the table can be used for multiple frequencies.

FIG. 9C illustrates an example lookup table including half the number of indices. Index 1 can be used for the frequency $F_1$ (first filter) and frequency $F_{12}$ (second filter); index 2 can be used for the frequency $F_2$ (first filter) and frequency $F_{11}$ (second filter); etc.

Equations (1)-(4), above, are indexing formulas that allow the system to retrieve a gain value corresponding to the nearest control frequency. Examples of the disclosure can include using one or more interpolation methods on the retrieved gain information to transform it to a more accurate value corresponding to the actual frequency.

For example, a remainder index $id_{rem}$ can be expressed as:

$$id_{rem} = \mathrm{mod}\left(\mathrm{loglog}\left(\frac{F_2}{F_1}\right), \log(2)\right) \qquad (5)$$

and a flooring index $id_F$ can be expressed as:

$$id_F = \left\lfloor 12 * \mathrm{loglog}\left(\frac{F}{F_1}\right) \middle/ \log(2) \right\rfloor + id_{F1} \qquad (6)$$

A linear interpolation may then produce a target index with the following:

$$\mathrm{gain}(F) = \mathrm{gain}(id_F) + (\mathrm{gain}(id_F + 1) - \mathrm{gain}(id_F)) * id_{rem} \qquad (7)$$

Gain Computation

As discussed above, in step 530, the system retrieves magnitude response information from a lookup table. The magnitude response information can be a gain value. The desired dB gains at low, mid, and high control frequencies of the dual-shelving equalizer can be expressed as:

$$\begin{pmatrix} G_l \\ G_m \\ G_h \end{pmatrix} = G \cdot \begin{pmatrix} K \\ K_l \\ K_h \end{pmatrix} \qquad (8)$$

where $K_l$ and $K_h$ are the dB gains of the low- and high-shelving filters at their control frequencies, respectively (as shown in FIG. 1), K is an additional broadband gain, and G is the gain conversion matrix.

The gain conversion matrix G can be written as:

$$G = \begin{pmatrix} 1 & 1 & G_{hl} \\ 1 & G_{lm} & G_{hm} \\ 1 & G_{lh} & 1 \end{pmatrix} \qquad (9)$$

where: (1) $G_{hl}$ is the dB gain of the high-shelving equalizer at the control frequency $F_l$, when its gain is set to +1 dB; (2) $G_{hm}$ is the dB gain of the high-shelving equalizer at the control frequency $F_m$, when its gain is set to +1 dB; (3) $G_{lm}$ is the dB gain of the low-shelving equalizer at the control frequency $F_m$, when its gain is set to +1 dB; and (4) $G_{lh}$ is the dB gain of the low-shelving equalizer at the control frequency $F_h$, when its gain is set to +1 dB.

From matrix inversion of Equation (9), a closed-form solution for the internal gains can be determined and expressed as:

$$\begin{pmatrix} K \\ K_l \\ K_h \end{pmatrix} = G^{-1} \cdot \begin{pmatrix} G_l \\ G_m \\ G_h \end{pmatrix} \qquad (10)$$

The inverse of the gain matrix can be expressed as:

$$G^{-1} = \frac{1}{\det(G)} \cdot G_1 \qquad (11)$$

where $$G_1 = \begin{pmatrix} G_{lm} - G_{hm} \cdot G_{lh} & G_{hl} \cdot G_{lh} - 1 & G_{hm} - G_{hl} \cdot G_{lm} \\ G_{hm} - 1 & 1 - G_{hl} & G_{hl} - G_{hm} \\ G_{lh} - G_{lm} & 1 - G_{lh} & G_{lm} - 1 \end{pmatrix} \qquad (12)$$

and $$\det(G) = G_{lm} + G_{hm} - G_{hm} \cdot G_{lh} + G_{hl} \cdot G_{lh} - G_{hl} \cdot G_{lm} - 1 \qquad (13)$$

From Equations (11)-(13), the system can compute the low- and high-shelving equalizer gains.

Independent Control Frequencies

In some embodiments, the control frequencies of the 3-band parametric equalizer may be different from the control frequencies of the dual-shelving filters. For example, the control frequencies of the 3-band parametric equalizer may be related to one or properties of the user, such as head size. On the other hand, the control frequencies of the shelving filters may be controlled through the system, which may not be based on the properties of the user. In this manner, the control frequencies of the 3-band parametric equalizer may be independent from the control frequencies of the dual-shelving filters.

The desired dB gains at low, mid, and high control frequencies of the dual-shelving equalizer can be expressed as:

$$\begin{pmatrix} G_l \\ G_m \\ G_h \end{pmatrix} = G \begin{pmatrix} K \\ K_{lc} \\ K_{hc} \end{pmatrix} \quad (14)$$

where $K_{lc}$ and $K_{hc}$ are the dB gains of the low- and high-shelving filters at their control frequencies, respectively, K is an additional broadband gain, and G is the gain conversion matrix.

From Equation (14), the gain conversion matrix G can be written as:

$$G = \begin{pmatrix} 1 & G_{lcl} & G_{hcl} \\ 1 & G_{lcm} & G_{hcm} \\ 1 & G_{lch} & G_{hch} \end{pmatrix} \quad (15)$$

where: (1) $G_{hcl}$ is the dB gain of the high-shelving equalizer at the control frequency $F_l$, when its gain is set to +1 dB; (2) $G_{hcm}$ is the dB gain of the high-shelving equalizer at the control frequency $F_m$, when its gain is set to +1 dB; (3) $G_{hch}$ is the dB gain of the high-shelving equalizer at the control frequency $F_h$, when its gain is set to +1 dB; (4) $G_{lcl}$ is the dB gain of the low-shelving equalizer at the control frequency $F_l$, when its gain is set to +1 dB; (5) $G_{lcm}$ is the dB gain of the low-shelving equalizer at the control frequency $F_m$, when its gain is set to +1 dB; and (6) $G_{lch}$ is the dB gain of the low-shelving equalizer at the control frequency $F_h$, when its gain is set to +1 dB.

From matrix inversion of Equation (15), a closed-form solution for the internal gains can be determined and expressed as:

$$\begin{pmatrix} K \\ K_{lc} \\ K_{hc} \end{pmatrix} = G^{-1} \begin{pmatrix} G_l \\ G_m \\ G_h \end{pmatrix} \quad (16)$$

The inverse of the gain matrix can be expressed as:

$$G^{-1} = \frac{1}{\det(G)} \cdot G_1 \quad (17)$$

where $$G_1 = \begin{pmatrix} G_{lcm} * G_{hch} - & G_{hcl} \cdot G_{lch} - & \\ G_{hcm} \cdot G_{lch} & G_{hch} * G_{lcl} & G_{lcl} * G_{hcm} - G_{hcl} \cdot G_{lcm} \\ G_{hcm} - G_{hch} & G_{hch} - G_{hcl} & G_{hcl} - G_{hcm} \\ G_{lch} - G_{lcm} & G_{lcl} - G_{lch} & G_{lcm} - G_{lcl} \end{pmatrix} \quad (18)$$

and $$\det(G) = G_{lcm} \cdot G_{hch} + G_{lcl} \cdot G_{hcm} - \\ G_{hcm} \cdot G_{lch} + G_{hcl} \cdot G_{lch} - G_{hcl} \cdot G_{lcm} - G_{lcl} \cdot G_{hch} \quad (19)$$

From Equations (17)-(19), the system can compute the low- and high-shelving equalizer gains.

Implementation of Filters

Figure 10:
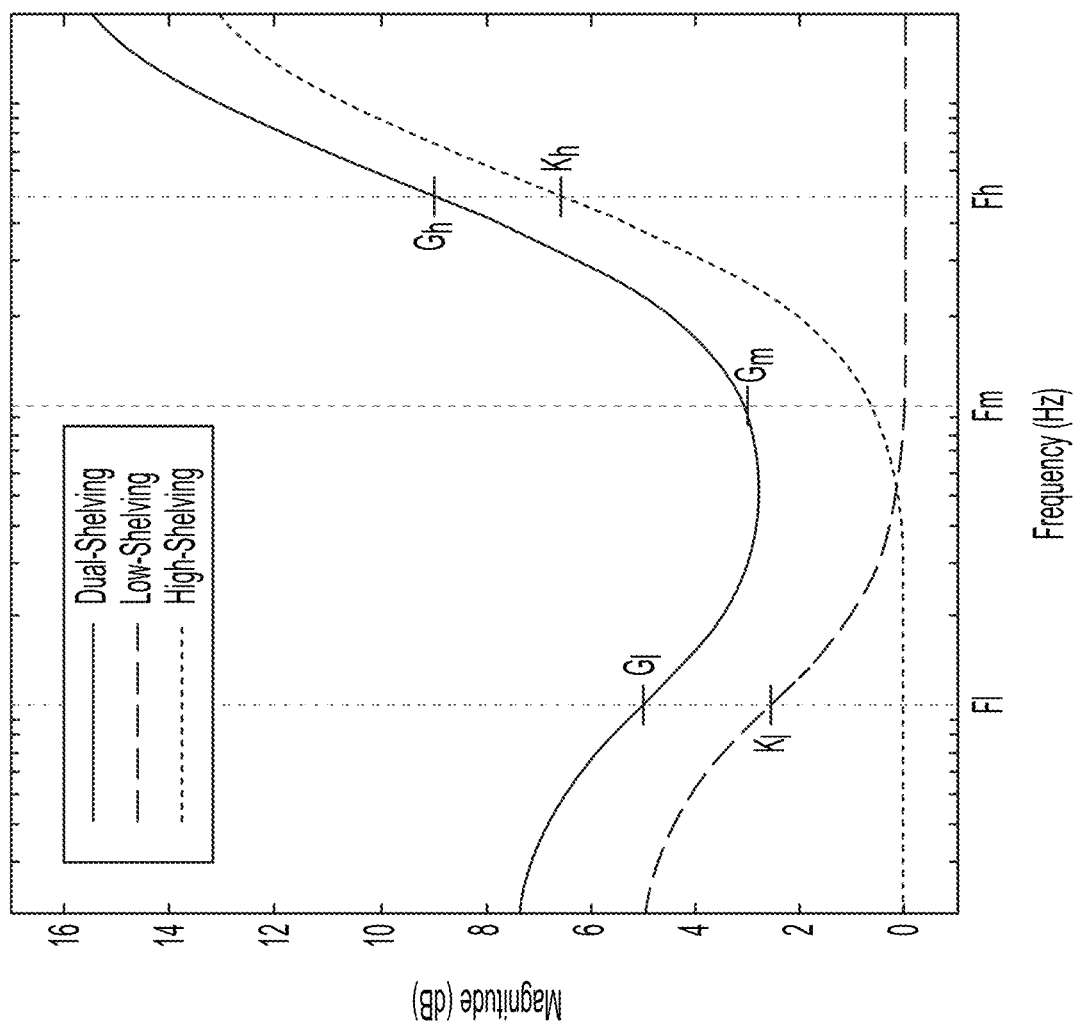
FIG. 10 shows an example magnitude response as a function of frequency for the low-shelving equalizer, the high-shelving equalizer, and the dual-shelving equalizer, according to some embodiments.

The filters can then easily be implemented based on their transfer functions. FIG. 10 shows an example magnitude response as a function of frequency for the low-shelving equalizer, the high-shelving equalizer, and the dual-shelving equalizer. The dual-shelving equalizer may be a 3-band equalizer having a plurality of control frequencies: a low control frequency $F_l$, a mid control frequency $F_m$, and a high control frequency $F_h$. In some examples, the control frequencies of the low-shelving equalizer and the high-shelving equalizer can match the low control frequency $F_l$ and the high control frequency $F_h$, respectively, of the dual-shelving equalizer.

The transfer function of a parametric low-shelving equalizer can be expressed as:

$$H(z) = \frac{(t\sqrt{k}+1)+(t\sqrt{k}-1)z^{-1}}{\left(\frac{t}{\sqrt{k}}+1\right)+\left(\frac{t}{\sqrt{k}}-1\right)z^{-1}} \quad (20)$$

where:

$$t = \tan\left(\frac{\omega}{2}\right) = \tan\left(\frac{\pi F_c}{F_S}\right) \quad (21)$$

k is the filter gain at DC, Fc is the control frequency of the low-shelving equalizer, and $F_S$ is the sampling frequency. In some examples, the gain at the control frequency ω is $\sqrt{k}$, which is half the decibel gain at DC.

The transfer function of a parametric high-shelving equalizer can be expressed as:

$$H(z) = \frac{(t\sqrt{k}+k)+(t\sqrt{k}-k)z^{-1}}{\left(\frac{t}{\sqrt{k}}+1\right)+\left(\frac{t}{\sqrt{k}}-1\right)z^{-1}} \quad (22)$$

Here, k is the filter gain at Nyquist. In some examples, the gain at the control frequency ω is k, which is half the decibel gain at Nyquist.

FIGS. 11A and 11B illustrate an exemplary magnitude response and an exemplary phase response, respectively, of a dual-shelving equalizer having a target magnitude response that monotonically decreases with frequency. This dual-shelving equalizer may be useful in many applications such as environment acoustic modeling applications. As shown in the figure, the magnitude response may continuously decrease as the frequency increases. The figure also shows the magnitude response of the low-shelving equalizer and the high-shelving equalizer. Using the above disclosed methods, the gain value of the dual-shelving equalizer at three control frequencies are determined to be: −2.5 dB at 200 Hz, −5.0 dB at 1000 Hz, and −12.0 dB at 5000 Hz. As such, the disclosed 3-band parametric equalizer achieves the magnitude response specified at the control frequencies with high accuracy.

Figure 12B:
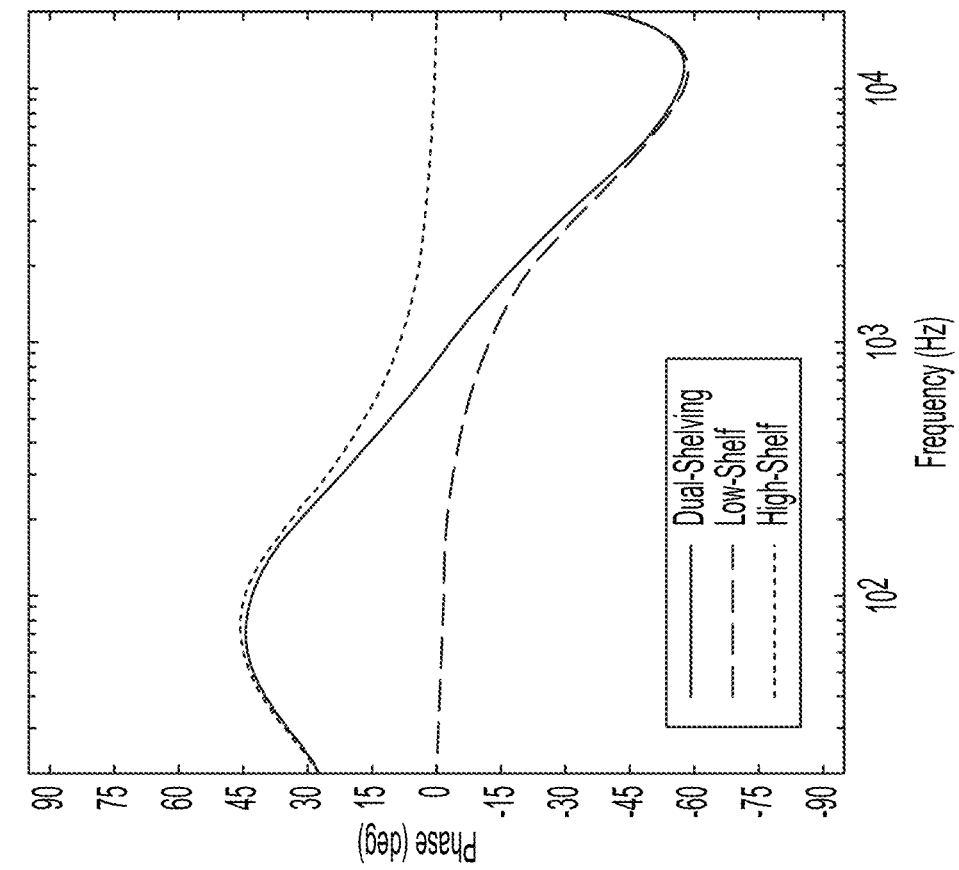
FIGS. 12A and 12B illustrate an exemplary magnitude response and an exemplary phase response, respectively, of a dual-shelving equalizer having a target magnitude response that does not monotonically decrease with frequency, according to some embodiments.
Figure 12A:
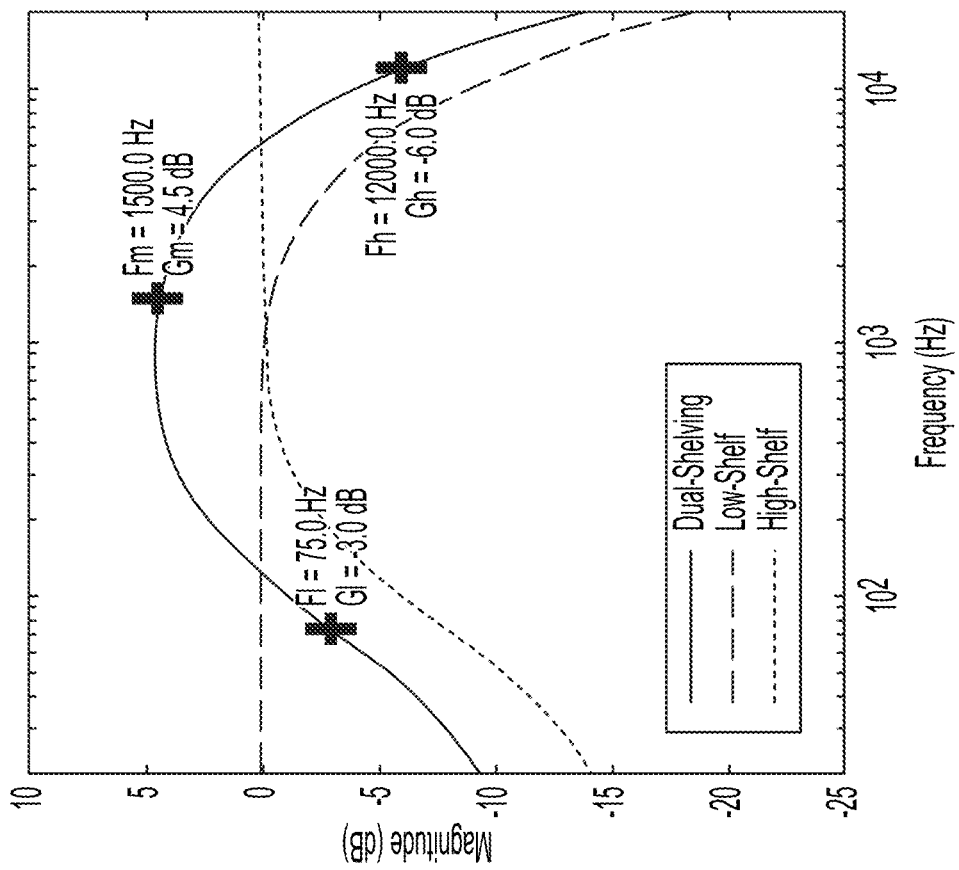

FIGS. 12A and 12B illustrate an exemplary magnitude response and an exemplary phase response, respectively, of a dual-shelving equalizer having a target magnitude response that does not monotonically decrease with frequency. As shown in the figure, the two shelving equalizers can be cascaded shelving equalizers having the same dB gain sign. The figure also shows the magnitude response of the low-shelving equalizer and the high-shelving equalizer. Using the above disclosed methods, the gain value of the dual-shelving equalizer at three control frequencies are determined to be: −3.0 dB at 75 Hz, 4.5 dB at 1500 Hz, and −6.0 dB at 12000 Hz. As such, the disclosed 3-band parametric equalizer achieves the magnitude response specified at the control frequencies with high accuracy.

Figure 13A:
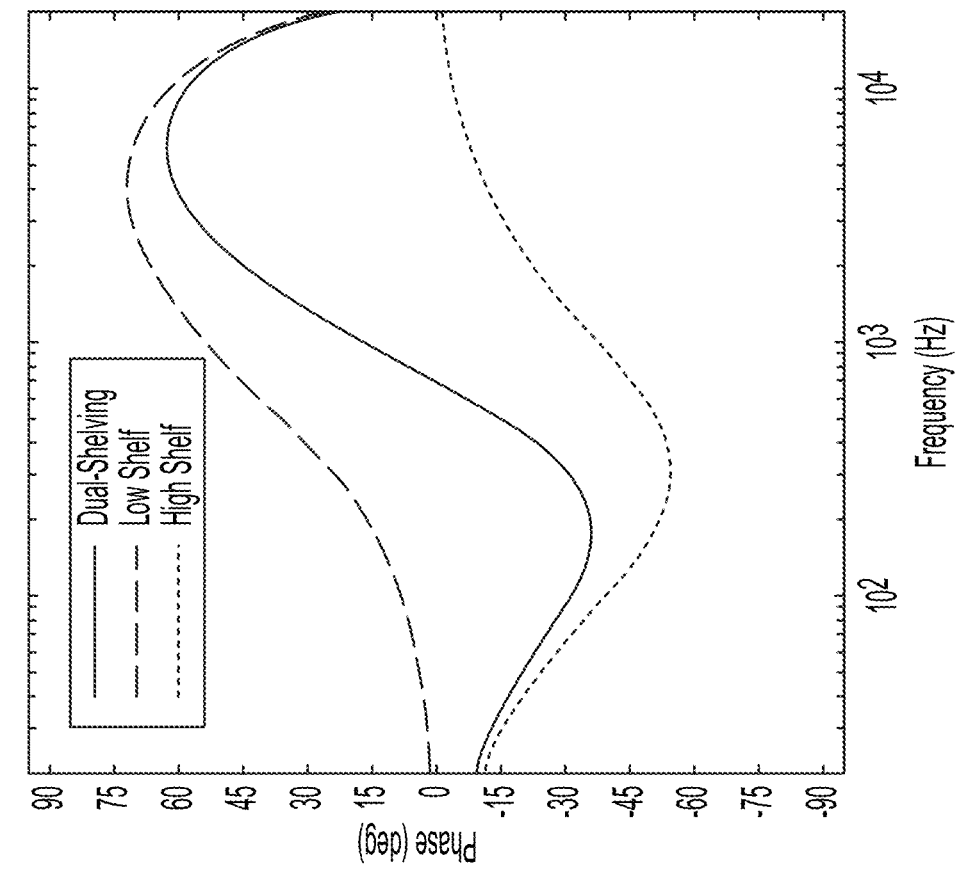
FIGS. 13A and 13B illustrate an exemplary magnitude response and an exemplary phase response, respectively, of a dual-shelving equalizer operated outside of its operational range, according to some embodiments.
Figure 13B:
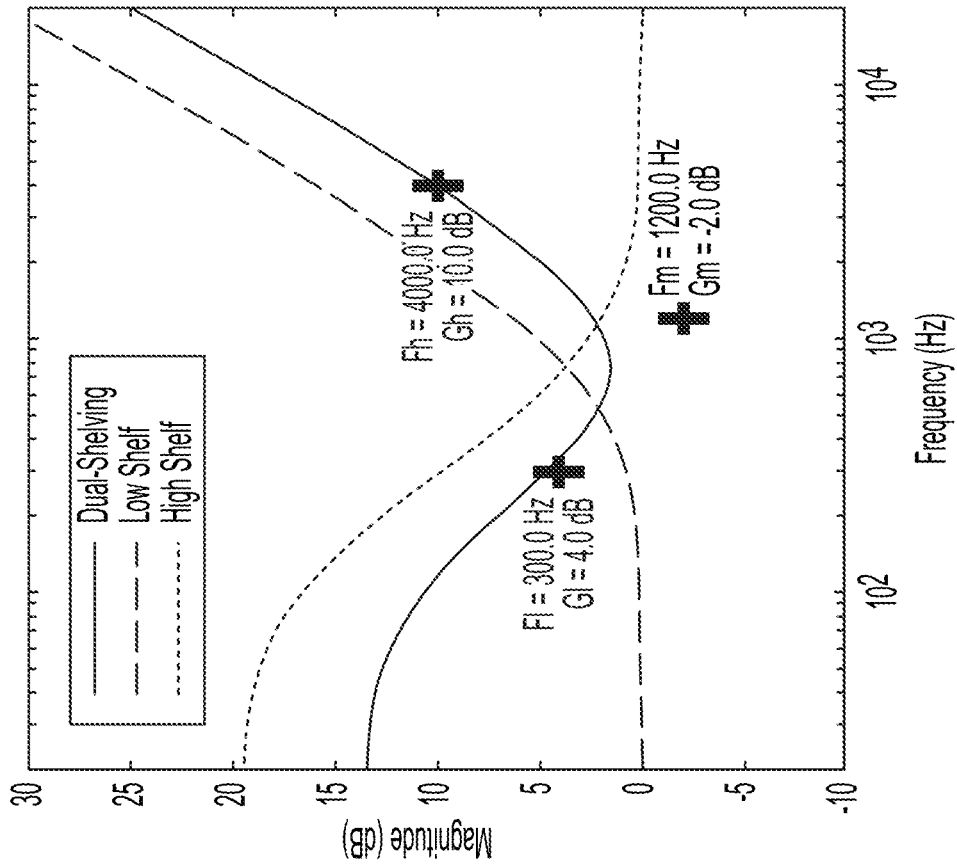

FIGS. 13A and 13B illustrate an exemplary magnitude response and an exemplary phase response, respectively, of a dual-shelving equalizer operated outside of its operational range. The dual-shelving equalizer may be operated outside of its operational range when the gains requested are too far apart for control points so close in frequency. The figure also shows the magnitude response of the low-shelving equalizer and the high-shelving equalizer. Using the above disclosed methods, the gain value of the dual-shelving equalizer at three control frequencies are determined to be: 4.0 dB at 300 Hz, −2.0 dB at 1200 Hz, and 10.0 dB at 4000 Hz. As shown in the figure, the middle gain $G_m$ may not be achieved (offset by about 5 dB).

As indicated above, the modification to the Ragalia-Mitra structure provides a design that respects exactly the proportionality property for shelving filters at three points: DC, Nyquist, and the filter's control frequency. At other frequencies, the proportionality relationship is approximately verified. In practice, for settings of the gain k within [−12 dB, +12 dB], the accuracy is sufficiently accurate for many audio applications.

With respect to the systems and methods described above, elements of the systems and methods can be implemented by one or more computer processors (e.g., CPUs or DSPs) as appropriate. The disclosure is not limited to any particular configuration of computer hardware, including computer processors, used to implement these elements. In some cases, multiple computer systems can be employed to implement the systems and methods described above. For example, a first computer processor (e.g., a processor of a wearable device coupled to a microphone) can be utilized to receive input microphone signals, and perform initial processing of those signals (e.g., signal conditioning and/or segmentation, such as described above). A second (and perhaps more computationally powerful) processor can then be utilized to perform more computationally intensive processing, such as determining probability values associated with speech segments of those signals. Another computer device, such as a cloud server, can host a speech recognition engine, to which input signals are ultimately provided. Other suitable configurations will be apparent and are within the scope of the disclosure.

Although the disclosed examples have been fully described with reference to the accompanying drawings, it is to be noted that various changes and modifications will become apparent to those skilled in the art. For example, elements of one or more implementations may be combined, deleted, modified, or supplemented to form further implementations. Such changes and modifications are to be understood as being included within the scope of the disclosed examples as defined by the appended claims.

The invention claimed is:

1. A method comprising:
   determining magnitude response information for a filter, the magnitude response information comprising a plurality of gain values, at least one of the plurality of gain values including a first gain corresponding to a first frequency;
   at a first time, storing the magnitude response information for the filter;
   at a second time later than the first time, retrieving the magnitude response information for the filter;
   for a control frequency of a plurality of control frequencies including the first frequency, determining a gain based on the retrieved magnitude response information of the filter and further based on an output of one or more sensors of a wearable head device;
   determining an audio signal based on the determined gain; and
   presenting the audio signal to a user of a wearable head device via one or more speakers of the wearable head device.

2. The method of claim 1, wherein the one or more sensors comprise an acoustic sensor of the wearable head device and wherein determining the audio signal comprises:
   presenting a test signal via the one or more speakers of the wearable head device;
   detecting an response signal via the acoustic sensor; and
   determining a relationship between the test signal and the response signal, wherein the audio signal is determined based on the relationship.

3. The method of claim 1, wherein determining the magnitude response information for the filter comprises:
   determining a magnitude response information of a high-shelving equalizer,
   scaling the magnitude response information of the high-shelving equalizer, and shifting the scaled magnitude response information of the high-shelving equalizer along a frequency axis by a predetermined frequency amount.

4. The method of claim 1, wherein determining the magnitude response information for the filter comprises:
   determining a magnitude response information of a low-shelving equalizer,
   scaling the magnitude response information of the low-shelving equalizer, and shifting the scaled magnitude response information of the low-shelving equalizer along a frequency axis by a predetermined frequency amount.

5. The method of claim 1, wherein the magnitude response information comprises a lookup table and wherein determining the gain comprises:
   determining an index associated with the first frequency;
   determining a lookup table index based on the index associated with the first frequency and further based on the output of the one or more sensors; and
   accessing the lookup table via the lookup table index.

6. The method of claim 1, wherein the magnitude response information comprises a lookup table and wherein determining the gain comprises:
   detecting an action of the user of the wearable head device via the one or more sensors;
   determining a parameter associated with an environment of the user, the parameter based on the detected action;
   determining a lookup table index based on the index associated with the first frequency and further based on the output of the one or more sensors; and
   accessing the lookup table via the lookup table index.

7. A wearable system comprising:
   a wearable head device comprising one or more sensors and one or more speakers; and
   one or more processors configured to execute a method comprising:
   determining magnitude response information for a filter, the magnitude response information comprising a plurality of gain values, at least one of the plurality of gain values including a first gain corresponding to a first frequency;

at a first time, storing the magnitude response information for the filter;

at a second time later than the first time, retrieving the magnitude response information for the filter;

for a control frequency of a plurality of control frequencies including the first frequency, determining a gain based on the retrieved magnitude response information of the filter and further based on an output of the one or more sensors;

determining an audio signal based on the determined gain; and presenting the audio signal to a user via the one or more speakers.

8. The wearable system of claim 7, wherein the one or more sensors comprise an acoustic sensor, and wherein determining the audio signal comprises:

presenting a test signal via the one or more speakers;
detecting an response signal via the acoustic sensor; and
determining a relationship between the test signal and the response signal, wherein the audio signal is determined based on the relationship.

9. The wearable system of claim 7, wherein determining the magnitude response information for the filter comprises:

determining a magnitude response information of a high-shelving equalizer, scaling the magnitude response information of the high-shelving equalizer, and shifting the scaled magnitude response information of the high-shelving equalizer along a frequency axis by a predetermined frequency amount.

10. The wearable system of claim 7, wherein determining the magnitude response information for the filter comprises:

determining a magnitude response information of a low-shelving equalizer, scaling the magnitude response information of the low-shelving equalizer, and shifting the scaled magnitude response information of the low-shelving equalizer along a frequency axis by a predetermined frequency amount.

11. The wearable system of claim 7, wherein the magnitude response information comprises a lookup table and wherein determining the gain comprises:

determining an index associated with the first frequency;
determining a lookup table index based on the index associated with the first frequency and further based on the output of the one or more sensors; and
accessing the lookup table via the lookup table index.

12. The wearable system of claim 7, wherein the magnitude response information comprises a lookup table and wherein determining the gain comprises:

detecting an action of the user of the wearable head device via the one or more sensors;
determining a parameter associated with an environment of the user, the parameter based on the detected action;
determining a lookup table index based on the index associated with the first frequency and further based on the output of the one or more sensors; and
accessing the lookup table via the lookup table index.

13. A non-transitory computer-readable medium storing instructions which, when executed by one or more processors, cause the one or more processors to perform a method comprising:

determining magnitude response information for a filter, the magnitude response information comprising a plurality of gain values, at least one of the plurality of gain values including a first gain corresponding to a first frequency;

at a first time, storing the magnitude response information for the filter;

at a second time later than the first time, retrieving the magnitude response information for the filter;

for a control frequency of a plurality of control frequencies including the first frequency, determining a gain based on the retrieved magnitude response information of the filter and further based on an output of one or more sensors of a wearable head device;

determining an audio signal based on the determined gain; and presenting the audio signal to a user of a wearable head device via one or more speakers of the wearable head device.

14. The non-transitory computer-readable medium of claim 13, wherein the one or more sensors comprise an acoustic sensor of the wearable head device and wherein determining the audio signal comprises:

presenting a test signal via the one or more speakers of the wearable head device;
detecting an response signal via the acoustic sensor; and
determining a relationship between the test signal and the response signal, wherein the audio signal is determined based on the relationship.

15. The non-transitory computer-readable medium of claim 13, wherein determining the magnitude response information for the filter comprises:

determining a magnitude response information of a high-shelving equalizer, scaling the magnitude response information of the high-shelving equalizer, and shifting the scaled magnitude response information of the high-shelving equalizer along a frequency axis by a predetermined frequency amount.

16. The non-transitory computer-readable medium of claim 13, wherein determining the magnitude response information for the filter comprises:

determining a magnitude response information of a low-shelving equalizer, scaling the magnitude response information of the low-shelving equalizer, and shifting the scaled magnitude response information of the low-shelving equalizer along a frequency axis by a predetermined frequency amount.

17. The non-transitory computer-readable medium of claim 13, wherein the magnitude response information comprises a lookup table and wherein determining the gain comprises:

determining an index associated with the first frequency;
determining a lookup table index based on the index associated with the first frequency and further based on the output of the one or more sensors; and
accessing the lookup table via the lookup table index.

18. The non-transitory computer-readable medium of claim 13, wherein the magnitude response information comprises a lookup table and wherein determining the gain comprises:

detecting an action of the user of the wearable head device via the one or more sensors;
determining a parameter associated with an environment of the user, the parameter based on the detected action;

determining a lookup table index based on the index associated with the first frequency and further based on the output of the one or more sensors; and accessing the lookup table via the lookup table index.

* * * * *